(12) United States Patent
Hara et al.

(10) Patent No.: US 8,044,831 B2
(45) Date of Patent: Oct. 25, 2011

(54) DECODING APPARATUS AND CONTROL METHOD THEREOF

(75) Inventors: Yuji Hara, Machida (JP); Hisashi Ishikawa, Urayasu (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 12/684,171

(22) Filed: Jan. 8, 2010

(65) Prior Publication Data

US 2010/0182171 A1 Jul. 22, 2010

(30) Foreign Application Priority Data

Jan. 16, 2009 (JP) ................................ 2009-008241
Jan. 16, 2009 (JP) ................................ 2009-008242

(51) Int. Cl.
*H03M 7/40* (2006.01)

(52) U.S. Cl. .......................................... 341/67; 341/59

(58) Field of Classification Search .................. 341/59, 341/65, 67; 382/238; 375/240.01; 348/500
See application file for complete search history.

(56) References Cited

U.S. PATENT DOCUMENTS

| | | | |
|---|---|---|---|
| 5,321,532 A | 6/1994 | Ishikawa et al. | 358/534 |
| 5,465,173 A | 11/1995 | Ishikawa et al. | 358/534 |
| 5,774,643 A | 6/1998 | Honma et al. | 395/109 |
| 5,784,012 A | 7/1998 | Kawauchi et al. | 341/67 |
| 5,903,360 A | 5/1999 | Honma et al. | 358/450 |
| 5,926,292 A | 7/1999 | Ishikawa et al. | 358/534 |
| 6,252,992 B1 | 6/2001 | Ishikawa | 382/239 |
| 6,603,413 B2 | 8/2003 | Igarashi et al. | 341/67 |
| 7,602,319 B2 * | 10/2009 | Suzumura et al. | 341/67 |
| 7,778,477 B2 * | 8/2010 | Lee et al. | 382/246 |
| 7,903,891 B2 * | 3/2011 | Sugimoto et al. | 382/238 |
| 2008/0037883 A1 | 2/2008 | Tsutsumi et al. | 382/232 |
| 2008/0285864 A1 | 11/2008 | Ishikawa | 382/232 |
| 2008/0292197 A1 | 11/2008 | Nakagawa et al. | 382/238 |
| 2008/0317362 A1 | 12/2008 | Hosaki et al. | 382/233 |
| 2009/0080531 A1 | 3/2009 | Hashiguchi et al. | 375/240.24 |
| 2009/0080786 A1 | 3/2009 | Tsutsumi et al. | 382/243 |

FOREIGN PATENT DOCUMENTS

| | | |
|---|---|---|
| JP | 9-284142 A | 10/1997 |
| JP | 2003-174365 A | 6/2003 |

* cited by examiner

*Primary Examiner* — Brian Young
(74) *Attorney, Agent, or Firm* — Fitzpatrick, Cella, Harper & Scinto

(57) ABSTRACT

The invention provides a decoding apparatus which guarantees a decoding speed of a predetermined unit. To this end, the decoding apparatus includes a shifter which detects a start bit of a codeword from coded data, a table which stores decode values of a plurality of symbol data at one address, a table which is used to store a shift amount of the shifter, a table which generates a data length of the decode values of the plurality of symbol data, a decoder which is used to generate an address of the first table from the coded data, a decoder which is used to generate an address of the second and third tables from the coded data, and a packer which couples or separates the decoded values of the plurality of symbol data to data for the predetermined fixed number of bits.

15 Claims, 17 Drawing Sheets

FIG. 1

| SINGLE CODEWORD | SINGLE SYMBOL (RUNLENGTH) |
|---|---|
| 00 | 0 |
| 01 | 1 |
| 100 | 2 |
| 101 | 3 |
| 11000100-11111111 | 4-63 |
| 110000 | EOB |

FIG. 2

| CODEWORD NUMBER | COUPLED CODEWORD (0-15) | | | | | | | | | | | | | | | | COUPLED SYMBOL (0-15) | | | | | | | | | | | | | | | |
|---|---|---|---|---|---|---|---|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| 0 | 0 | 0 | 0 | 0 | | | | | | | | | | | | | 1 | | | | | | | | | | | | | | | |
| 1 | 0 | 0 | 0 | 1 | | | | | | | | | | | | | 1 | 0 | | | | | | | | | | | | | | |
| 2 | 0 | 0 | 1 | 0 | | | | | | | | | | | | | 1 | 0 | 0 | | | | | | | | | | | | | |
| 3 | 0 | 0 | 1 | 1 | | | | | | | | | | | | | 1 | 0 | 0 | 0 | | | | | | | | | | | | |
| 4 | 0 | 0 | 1 | 1 | * | * | * | * | * | * | | | | | | | 1 | 0 | 0 | 0 | 0 | | | | | | | | | | | |
| 5 | 0 | 1 | 0 | 0 | | | | | | | | | | | | | 1 | 1 | 0 | | | | | | | | | | | | | |
| 6 | 0 | 1 | 0 | 1 | | | | | | | | | | | | | 1 | 1 | 0 | 0 | | | | | | | | | | | | |
| 7 | 0 | 1 | 1 | 0 | 0 | | | | | | | | | | | | 1 | 1 | 0 | 0 | 0 | | | | | | | | | | | |
| 8 | 0 | 1 | 1 | 0 | 1 | | | | | | | | | | | | 1 | 1 | 0 | 0 | 0 | 0 | | | | | | | | | | |
| 9 | 0 | 1 | 1 | 1 | * | * | * | * | * | * | | | | | | | 1 | 1 | 0 | 0 | 0 | 0 | 0 | | | | | | | | | |
| 10 | 1 | 0 | 0 | 0 | 0 | | | | | | | | | | | | 1 | 1 | 1 | | | | | | | | | | | | | |
| 11 | 1 | 0 | 0 | 0 | 1 | | | | | | | | | | | | 1 | 1 | 1 | 0 | | | | | | | | | | | | |
| 12 | 1 | 0 | 0 | 1 | 0 | 0 | | | | | | | | | | | 1 | 1 | 1 | 0 | 0 | | | | | | | | | | | |
| 13 | 1 | 0 | 0 | 1 | 0 | 1 | | | | | | | | | | | 1 | 1 | 1 | 0 | 0 | 0 | | | | | | | | | | |
| 14 | 1 | 0 | 0 | 1 | 1 | * | * | * | * | * | | | | | | | 1 | 1 | 1 | 1 | 0 | 0 | 0 | 0 | | | | | | | | |
| 15 | 1 | 0 | 1 | 0 | 0 | | | | | | | | | | | | 1 | 1 | 1 | 1 | 0 | | | | | | | | | | | |
| 16 | 1 | 0 | 1 | 0 | 1 | | | | | | | | | | | | 1 | 1 | 1 | 1 | 0 | 0 | | | | | | | | | | |
| 17 | 1 | 0 | 1 | 1 | 0 | 0 | | | | | | | | | | | 1 | 1 | 1 | 1 | 0 | 0 | 0 | | | | | | | | | |
| 18 | 1 | 0 | 1 | 1 | 0 | 1 | | | | | | | | | | | 1 | 1 | 1 | 1 | 0 | 0 | 0 | 0 | | | | | | | | |
| 19 | 1 | 0 | 1 | 1 | 1 | * | * | * | * | * | | | | | | | 1 | 1 | 1 | 1 | 0 | 0 | 0 | 0 | 0 | | | | | | | |
| 20 | 1 | 1 | * | * | * | * | * | * | * | * | | | | | | | 1 | 1 | 1 | 1 | 1 | 1 | 1 | 1 | 0 | 1 | | | | | | |

FIG. 4

| CODEWORD NUMBER | ADDRESS | COUPLED CODEWORD 0 1 2 3 4 5 6 7 8 9 10 11 12 13 14 15 | COUPLED SYMBOL 0 1 2 3 4 5 6 7 8 9 10 11 12 13 14 15 |
|---|---|---|---|
| 0 | 0 | 0 0 0 0 | 1 0 0 0 0 |
| 1 |   | 0 0 0 1 | 1 0 1 0 0 |
| 2 |   | 0 0 1 0 | 1 0 0 0 0 |
| 3 |   | 0 0 1 1 0 0 | 1 0 0 0 0 |
| 4 |   | 0 0 1 1 0 1 | 1 0 0 0 0 |
| 5 | 1 | 0 1 0 0 | 1 1 0 0 0 |
| 6 |   | 0 1 0 1 | 1 1 0 0 0 |
| 7 |   | 0 1 1 0 | 1 1 0 0 0 |
| 8 |   | 0 1 1 1 | 1 1 0 0 0 |
| 9 |   | 0 1 1 1 1 1 * * * | 1 1 0 0 0 |
| 10 | 2 | 1 0 0 0 | 1 1 1 0 0 |
| 11 |   | 1 0 0 1 | 1 1 1 0 0 |
| 12 |   | 1 0 1 0 0 | 1 1 1 0 0 |
| 13 |   | 1 0 1 0 1 | 1 1 1 0 0 |
| 14 |   | 1 0 1 1 0 0 1 * * * | 1 1 1 0 0 |
| 15 | 3 | 1 0 1 1 0 0 | 1 1 1 1 0 |
| 16 |   | 1 0 1 1 0 1 | 1 1 1 1 0 |
| 17 |   | 1 0 1 1 1 0 0 | 1 1 1 1 0 |
| 18 |   | 1 0 1 1 1 0 1 | 1 1 1 1 0 |
| 19 |   | 1 0 1 1 1 1 * * * | 1 1 1 1 0 |
| 20 | 4 | 1 1 * * * | 1 1 1 1 1 |

FIG. 5

| CODEWORD NUMBER | ADDRESS | COUPLED CODEWORD 0 1 2 3 4 5 6 7 8 9 10 11 12 13 14 15 | PACK LENGTH | BASE VALUE | NUMBER OF "1"S | SHIFT AMOUNT | COUPLED SYMBOL DATA 0 1 2 3 4 5 6 7 8 9 10 11 12 13 14 15 |
|---|---|---|---|---|---|---|---|
| 0 | 0 | 0 0 0 0 | 2 | 2 | 0 | 4 | 1 0 0 0 0 0 0 0 0 |
| 1 | | 0 0 0 1 | 3 | 2 | 1 | 4 | 1 1 0 0 0 0 0 0 0 |
| 2 | | 0 0 1 0 0 | 3 | 2 | 1 | 4 | 1 1 0 0 0 0 0 0 0 |
| 3 | | 0 0 1 0 1 | 4 | 2 | 2 | 4 | 1 1 1 0 0 0 0 0 0 |
| 4 | 1 | 0 0 1 1 0 0 | 4 | 4 | 0 | 5 | 1 1 0 0 0 0 0 0 0 |
| 5 | | 0 0 1 1 0 1 | 5 | 4 | 1 | 5 | 1 1 0 0 0 0 0 0 0 |
| 6 | | 0 0 1 1 1 0 | 5 | 4 | 1 | 5 | 1 1 0 0 0 0 0 0 0 |
| 7 | | 0 0 1 1 1 1 | 6 | 4 | 2 | 5 | 1 1 1 0 0 0 0 0 0 |
| 8 | 2 | 0 1 * 1 1 | EOB | 64 | 0+n | 8 | 1 1 1 1 0 0 0 0 0 |
| 9 | 3 | 0 1 1 1 # # # # | 2+n | 2 | 0+n | 10 | 1 0 0 0 0 0 0 0 0 |
| 10 | | 0 1 1 1 # # # # | 3+n | 2 | 1+n | 10 | 1 1 0 0 0 0 0 0 0 |
| 11 | 4 | 1 0 0 0 0 | 4 | 4 | 0 | 5 | 1 1 0 0 0 0 0 0 0 |
| 12 | | 1 0 0 0 1 | 5 | 4 | 1 | 5 | 1 1 0 0 0 0 0 0 0 |
| 13 | | 1 0 0 1 0 | 5 | 4 | 1 | 5 | 1 1 0 0 0 0 0 0 0 |
| 14 | | 1 0 0 1 1 | 6 | 4 | 2 | 5 | 1 1 1 0 0 0 0 0 0 |
| 15 | 5 | 1 0 1 0 0 0 | 6 | 6 | 0 | 6 | 1 1 1 1 0 0 0 0 0 |
| 16 | 6 | 1 0 1 0 0 1 | 6 | 6 | 1 | 6 | 1 1 1 1 0 0 0 0 0 |
| 17 | | 1 0 1 1 0 0 | 7 | 6 | 1 | 6 | 1 1 1 1 0 0 0 0 0 |
| 18 | | 1 0 1 1 0 1 | 7 | 6 | 2 | 6 | 1 1 1 1 1 0 0 0 0 |
| 19 | | 1 0 1 1 1 0 | 8 | 6 | 2 | 6 | 1 1 1 1 1 0 0 0 0 |
| 20 | 7 | 1 0 1 1 1 1 * | EOB | 64 | 0+n | 9 | 1 0 0 0 0 0 0 0 0 |
| 21 | | 1 1 0 1 # # # # | 4+n | 4 | 0+n | 11 | 1 1 0 0 0 0 0 0 0 |
| 22 | 8 | 1 1 0 1 1 # # # # | 5+n | 4 | 1+n | 11 | 1 1 1 0 0 0 0 0 0 |
| 23 | 9 | 1 1 1 0 0 * | EOB | 64 | 0+n | 6 | 1 1 1 0 0 0 0 0 0 |
| | | 1 1 1 * * * * * | 1+n | 1 | 0+n | 8 | 1 1 1 1 1 1 1 1 1 |

FIG. 6

| CYCLE | sdata_n | | | | | end_n | plen_n | sum_n | spt_n | ept_n | ext_n | expt_n | pcnt_n | busy_n | rest_n | valid_n | ocnt_n |
| --- | --- | --- | --- | --- | --- | --- | --- | --- | --- | --- | --- | --- | --- | --- | --- | --- | --- |
| | 0 | 1 | 2 | 3 | 4 | | | | | | | | | | | | |
| 0 | | | | | | 0 | 0 | 0 | 0 | 0 | 0 | 0 | 0 | 0 | 0 | 0 | 0 |
| 1 | 1 | 0 | 0 | 0 | 0 | 0 | 2 | 2 | 0 | 1 | 0 | 2 | 0 | 0 | 0 | 0 | 0 |
| 2 | 1 | 0 | 0 | 0 | 0 | 0 | 5 | 7 | 2 | 6 | 0 | 7 | 0 | 0 | 0 | 0 | 0 |
| 3 | 1 | 1 | 1 | 0 | 0 | 0 | 7 | 14 | 7 | 13 | 1 | 12 | 0 | 0 | 0 | 0 | 0 |
| 4 | 1 | 1 | 1 | 0 | 0 | 0 | 17 | 31 | 14 | 30 | 1 | 19 | 1 | 0 | 1 | 0 | 0 |
| 5 | 1 | 1 | 1 | 1 | 0 | 0 | 19 | 50 | 31 | 49 | 1 | 36 | 3 | 0 | 2 | 1 | 1 |
| 6 | 1 | 0 | 0 | 0 | 0 | 0 | 64 | 114 | 50 | 63 | 1 | 55 | 4 | 1 | 2 | 1 | 2 |
| 7 | 1 | 0 | 0 | 0 | 0 | 1 | 64 | 114 | 50 | 63 | 1 | 55 | 4 | 1 | 1 | 1 | 3 |
| 8 | 0 | 0 | 0 | 0 | 0 | 1 | 64 | 0 | 0 | 0 | 1 | 0 | 0 | 0 | 0 | 1 | 4 |

| buf_n(0:15) | buf_n(16:31) | buf_n(32:47) | buf_n(48:63) | OUTPUT |
| --- | --- | --- | --- | --- |
| ---- | ---- | ---- | ---- | - |
| '10_10000------ | ---- | ---- | ---- | - |
| '1010000111000--- | ---- | ---- | ---- | - |
| '1010000111100001 | '0000000000000000 | ---- | ---- | - |
| '1010000111100001 | '0000000000000000 | ---- | ---- | - |
| '1010000111100001 | '1100000000000000 | ---- | ---- | buf_5(0:15) |
| '1010000111100001 | '1100000000000000 | '1100000000000000 | ---- | buf_6(16:31) |
| '1010000111100001 | '1100000000000000 | '1100000000000000 | '00------ | buf_7(32:47) |
| '1010000111100001 | '1100000000000000 | '1100000000000000 | '0010000000000000 | buf_8(48:63) |

FIG. 7A

| CODE-WORD NUMBER | COUPLED CODEWORD | | | | | | | | | | | | | | | | COUPLED SYMBOL | | | | | | | | | | | | | | | |
|---|---|---|---|---|---|---|---|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| 0 | 0 | 0 | 0 | 0 | 0 | 0 | | | | | | | | | | | 1 | 0 | 1 | | | | | | | | | | | | | |
| 1 | 0 | 0 | 0 | 0 | 0 | 1 | | | | | | | | | | | 1 | 0 | 1 | 1 | | | | | | | | | | | | |
| 2 | 0 | 0 | 0 | 0 | 1 | 0 | 0 | | | | | | | | | | 1 | 0 | 1 | 1 | 1 | | | | | | | | | | | |
| 3 | 0 | 0 | 0 | 0 | 1 | 0 | 1 | | | | | | | | | | 1 | 0 | 1 | 1 | 1 | 1 | | | | | | | | | | |
| 4 | 0 | 0 | 0 | 0 | 1 | 1 | * | * | * | * | * | * | * | * | * | | 1 | 0 | 1 | 1 | 1 | * | * | * | * | 1 | | | | | | |
| 5 | 0 | 0 | 0 | 1 | 0 | 0 | | | | | | | | | | | 1 | 0 | 0 | 1 | | | | | | | | | | | | |
| 6 | 0 | 0 | 0 | 1 | 0 | 1 | | | | | | | | | | | 1 | 0 | 0 | 1 | 1 | | | | | | | | | | | |
| 7 | 0 | 0 | 0 | 1 | 1 | 0 | 0 | | | | | | | | | | 1 | 0 | 0 | 1 | 1 | 1 | | | | | | | | | | |
| 8 | 0 | 0 | 0 | 1 | 1 | 0 | 1 | | | | | | | | | | 1 | 0 | 0 | 1 | 1 | 1 | 1 | | | | | | | | | |
| 9 | 0 | 0 | 0 | 1 | 1 | 1 | * | * | * | * | * | * | * | * | * | | 1 | 0 | 0 | 1 | 1 | * | * | * | * | 1 | | | | | | |
| 10 | 0 | 0 | 1 | 0 | 0 | 0 | 0 | | | | | | | | | | 1 | 0 | 0 | 0 | 1 | | | | | | | | | | | |
| 11 | 0 | 0 | 1 | 0 | 0 | 0 | 1 | | | | | | | | | | 1 | 0 | 0 | 0 | 1 | 1 | | | | | | | | | | |
| 12 | 0 | 0 | 1 | 0 | 0 | 1 | 0 | 0 | | | | | | | | | 1 | 0 | 0 | 0 | 1 | 1 | 1 | | | | | | | | | |
| 13 | 0 | 0 | 1 | 0 | 0 | 1 | 0 | 1 | | | | | | | | | 1 | 0 | 0 | 0 | 1 | 1 | 1 | 1 | | | | | | | | |
| 14 | 0 | 0 | 1 | 0 | 0 | 1 | 1 | * | * | * | * | * | * | * | * | | 1 | 0 | 0 | 0 | 1 | 1 | * | * | * | 1 | | | | | | |
| 15 | 0 | 0 | 1 | 0 | 1 | 0 | 0 | | | | | | | | | | 1 | 0 | 0 | 0 | 0 | 1 | | | | | | | | | | |
| 16 | 0 | 0 | 1 | 0 | 1 | 0 | 1 | | | | | | | | | | 1 | 0 | 0 | 0 | 0 | 1 | 1 | | | | | | | | | |
| 17 | 0 | 0 | 1 | 0 | 1 | 1 | 0 | 0 | | | | | | | | | 1 | 0 | 0 | 0 | 0 | 1 | 1 | 1 | | | | | | | | |
| 18 | 0 | 0 | 1 | 0 | 1 | 1 | 0 | 1 | | | | | | | | | 1 | 0 | 0 | 0 | 0 | 1 | 1 | 1 | 1 | | | | | | | |
| 19 | 0 | 0 | 1 | 0 | 1 | 1 | 1 | * | * | * | * | * | * | * | * | | 1 | 0 | 0 | 0 | 0 | 1 | 1 | * | * | 1 | | | | | | |
| 20 | 0 | 0 | 1 | 1 | * | * | * | * | * | * | * | * | * | * | * | | 1 | 0 | 0 | 0 | 0 | 0 | 0 | 0 | * | 0 | | | | | | |
| 21 | 0 | 1 | 0 | 0 | 0 | 0 | | | | | | | | | | | 1 | 1 | 0 | 1 | | | | | | | | | | | | |
| 22 | 0 | 1 | 0 | 0 | 0 | 1 | | | | | | | | | | | 1 | 1 | 0 | 1 | 1 | | | | | | | | | | | |
| 23 | 0 | 1 | 0 | 0 | 1 | 0 | 0 | | | | | | | | | | 1 | 1 | 0 | 1 | 1 | 1 | | | | | | | | | | |
| 24 | 0 | 1 | 0 | 0 | 1 | 0 | 1 | | | | | | | | | | 1 | 1 | 0 | 1 | 1 | 1 | 1 | | | | | | | | | |
| 25 | 0 | 1 | 0 | 0 | 1 | 1 | * | * | * | * | * | * | * | * | * | | 1 | 1 | 0 | 1 | 1 | * | * | * | * | 1 | | | | | | |
| 26 | 0 | 1 | 0 | 1 | 0 | 0 | | | | | | | | | | | 1 | 1 | 0 | 0 | 1 | | | | | | | | | | | |
| 27 | 0 | 1 | 0 | 1 | 0 | 1 | | | | | | | | | | | 1 | 1 | 0 | 0 | 1 | 1 | | | | | | | | | | |
| 28 | 0 | 1 | 0 | 1 | 1 | 0 | 0 | | | | | | | | | | 1 | 1 | 0 | 0 | 1 | 1 | 1 | | | | | | | | | |
| 29 | 0 | 1 | 0 | 1 | 1 | 0 | 1 | | | | | | | | | | 1 | 1 | 0 | 0 | 1 | 1 | 1 | 1 | | | | | | | | |
| 30 | 0 | 1 | 0 | 1 | 1 | 1 | * | * | * | * | * | * | * | * | * | | 1 | 1 | 0 | 0 | 1 | 1 | 1 | 1 | 1 | 1 | | | | | | |
| 31 | 0 | 1 | 1 | 0 | 0 | 0 | 0 | | | | | | | | | | 1 | 1 | 0 | 0 | 0 | 1 | | | | | | | | | | |
| 32 | 0 | 1 | 1 | 0 | 0 | 0 | 1 | | | | | | | | | | 1 | 1 | 0 | 0 | 0 | 1 | 1 | | | | | | | | | |
| 33 | 0 | 1 | 1 | 0 | 0 | 1 | 0 | 0 | | | | | | | | | 1 | 1 | 0 | 0 | 0 | 1 | 1 | 1 | | | | | | | | |
| 34 | 0 | 1 | 1 | 0 | 0 | 1 | 0 | 1 | | | | | | | | | 1 | 1 | 0 | 0 | 0 | 1 | 1 | 1 | 1 | | | | | | | |
| 35 | 0 | 1 | 1 | 0 | 0 | 1 | 1 | * | * | * | * | * | * | * | * | | 1 | 1 | 0 | 0 | 0 | 1 | 1 | * | * | 1 | | | | | | |
| 36 | 0 | 1 | 1 | 0 | 1 | 0 | 0 | | | | | | | | | | 1 | 1 | 0 | 0 | 0 | 0 | 1 | | | | | | | | | |
| 37 | 0 | 1 | 1 | 0 | 1 | 0 | 1 | | | | | | | | | | 1 | 1 | 0 | 0 | 0 | 0 | 1 | 1 | | | | | | | | |
| 38 | 0 | 1 | 1 | 0 | 1 | 1 | 0 | 0 | | | | | | | | | 1 | 1 | 0 | 0 | 0 | 0 | 1 | 1 | 1 | | | | | | | |
| 39 | 0 | 1 | 1 | 0 | 1 | 1 | 0 | 1 | | | | | | | | | 1 | 1 | 0 | 0 | 0 | 0 | 1 | 1 | 1 | 1 | | | | | | |
| 40 | 0 | 1 | 1 | 0 | 1 | 1 | 1 | * | * | * | * | * | * | * | * | | 1 | 1 | 0 | 0 | 0 | 0 | 1 | 1 | * | 1 | | | | | | |
| 41 | 0 | 1 | 1 | 1 | * | * | * | * | * | * | * | * | * | * | * | | 1 | 1 | 0 | 0 | 0 | 0 | 0 | 0 | * | 0 | | | | | | |
| 42 | 1 | 0 | 0 | 0 | 0 | 0 | 0 | | | | | | | | | | 1 | 1 | 1 | 0 | 1 | | | | | | | | | | | |

FIG. 7B

| CODE-WORD NUMBER | COUPLED CODEWORD 0 1 2 3 4 5 6 7 8 9 10 11 12 13 14 15 | COUPLED SYMBOL 0 1 2 3 4 5 6 7 8 9 10 11 12 13 14 15 |
|---|---|---|
| 43 | 1 0 0 0 0 0 1 | 1 1 1 0 1 1 |
| 44 | 1 0 0 0 0 1 0 0 | 1 1 1 0 1 1 1 |
| 45 | 1 0 0 0 0 1 0 1 | 1 1 1 0 1 1 1 1 |
| 46 | 1 0 0 0 0 1 1 * * * * * * * | 1 1 1 0 1 1 * * * 1 |
| 47 | 1 0 0 0 1 0 0 | 1 1 1 0 0 0 |
| 48 | 1 0 0 0 1 0 1 | 1 1 1 0 0 0 1 |
| 49 | 1 0 0 0 1 1 0 0 | 1 1 1 0 0 1 1 1 |
| 50 | 1 0 0 0 1 1 0 1 | 1 1 1 0 0 1 1 1 1 |
| 51 | 1 0 0 0 1 1 1 * * * * * * * | 1 1 1 0 0 1 * * * 1 |
| 52 | 1 0 0 1 0 0 0 0 | 1 1 1 0 0 0 1 |
| 53 | 1 0 0 1 0 0 0 1 | 1 1 1 0 0 0 1 1 |
| 54 | 1 0 0 1 0 0 1 0 0 | 1 1 1 0 0 0 1 1 1 |
| 55 | 1 0 0 1 0 0 1 0 1 | 1 1 1 0 0 0 1 1 1 1 |
| 56 | 1 0 0 1 0 0 1 1 * * * * * * * | 1 1 1 0 0 0 1 * * * 1 |
| 57 | 1 0 0 1 0 1 0 0 | 1 1 1 0 0 0 0 1 |
| 58 | 1 0 0 1 0 1 0 1 | 1 1 1 0 0 0 0 1 1 |
| 59 | 1 0 0 1 0 1 1 0 0 | 1 1 1 0 0 0 0 1 1 1 |
| 60 | 1 0 0 1 0 1 1 0 1 | 1 1 1 0 0 0 0 1 1 1 1 |
| 61 | 1 0 0 1 0 1 1 1 * * * * * * | 1 1 1 0 0 0 0 * * * 1 |
| 62 | 1 0 0 1 1 * * * * * * * * * | 1 1 1 0 0 0 0 0 0 0 * * 0 |
| 63 | 1 0 1 0 0 0 0 0 | 1 1 1 1 0 1 |
| 64 | 1 0 1 0 0 0 0 1 | 1 1 1 1 0 1 1 |
| 65 | 1 0 1 0 0 0 1 0 0 | 1 1 1 1 0 1 1 1 |
| 66 | 1 0 1 0 0 0 1 0 1 | 1 1 1 1 0 1 1 1 1 |
| 67 | 1 0 1 0 0 0 1 1 * * * * * * | 1 1 1 1 0 1 * * * 1 |
| 68 | 1 0 1 0 1 0 0 | 1 1 1 1 0 0 1 |
| 69 | 1 0 1 0 1 0 1 | 1 1 1 1 0 0 1 1 |
| 70 | 1 0 1 0 1 1 0 0 | 1 1 1 1 0 0 1 1 1 |
| 71 | 1 0 1 0 1 1 0 1 | 1 1 1 1 0 0 1 1 1 1 |
| 72 | 1 0 1 0 1 1 1 * * * * * * * | 1 1 1 1 0 0 * * * 1 |
| 73 | 1 0 1 1 0 0 0 0 | 1 1 1 1 0 0 0 1 |
| 74 | 1 0 1 1 0 0 0 1 | 1 1 1 1 0 0 0 1 1 |
| 75 | 1 0 1 1 0 0 1 0 0 | 1 1 1 1 0 0 0 1 1 1 |
| 76 | 1 0 1 1 0 0 1 0 1 | 1 1 1 1 0 0 0 1 1 1 1 |
| 77 | 1 0 1 1 0 0 1 1 * * * * * * | 1 1 1 1 0 0 0 * * * 1 |
| 78 | 1 0 1 1 0 1 0 0 | 1 1 1 1 0 0 0 0 1 |
| 79 | 1 0 1 1 0 1 0 1 | 1 1 1 1 0 0 0 0 1 1 |
| 80 | 1 0 1 1 0 1 1 0 0 | 1 1 1 1 0 0 0 0 1 1 1 |
| 81 | 1 0 1 1 0 1 1 0 1 | 1 1 1 1 0 0 0 0 1 1 1 1 |
| 82 | 1 0 1 1 0 1 1 1 * * * * * * | 1 1 1 1 0 0 0 0 * * * 1 |
| 83 | 1 0 1 1 1 * * * * * * * * * | 1 1 1 1 0 0 0 0 0 0 0 * * 0 |
| 84 | 1 1 * * * * * * * * * * * * | 1 1 1 1 1 1 1 1 1 1 1 1 * * 1 |

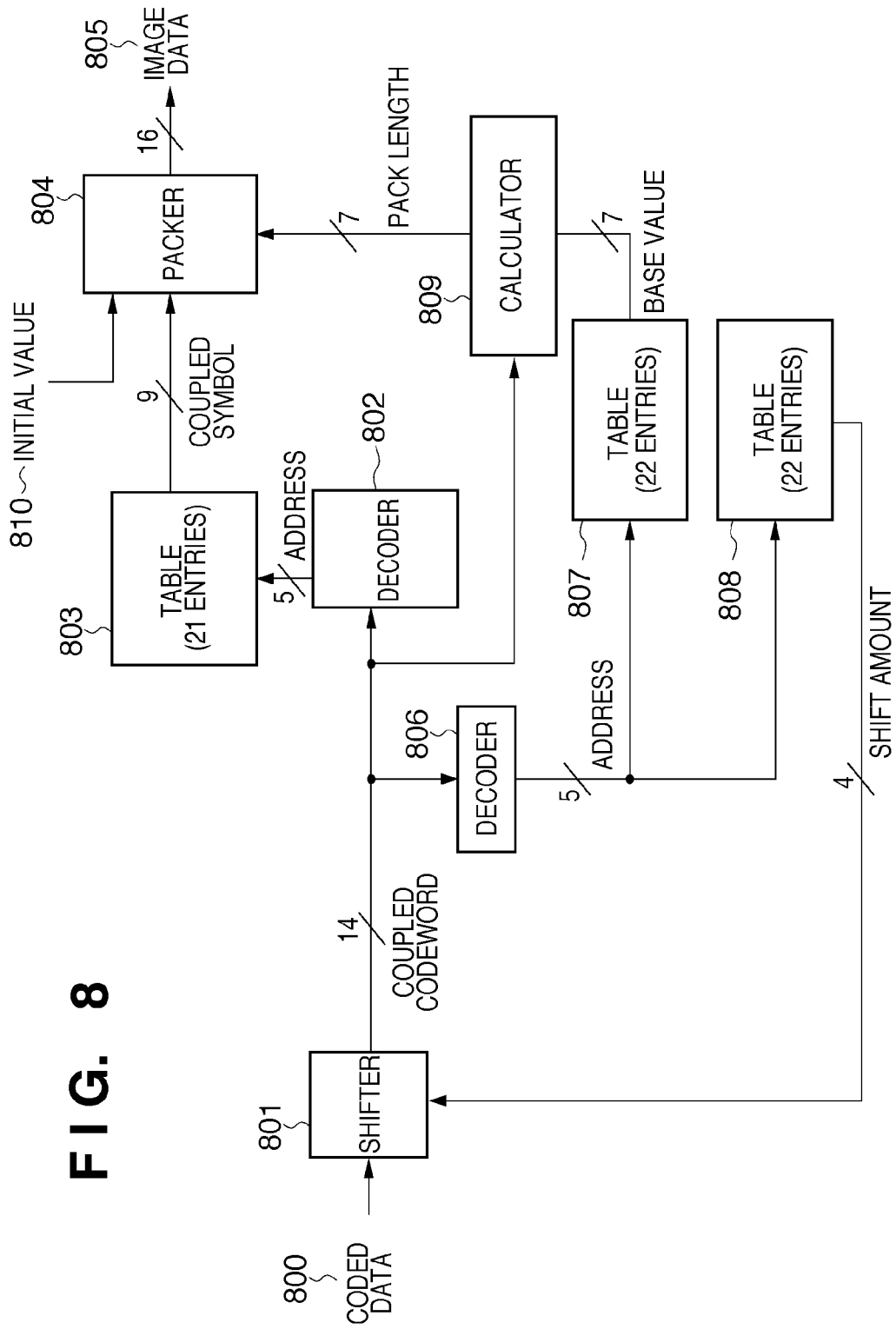

FIG. 9A

| CODEWORD NUMBER | ADDRESS | COUPLED CODEWORD (0-15) | COUPLED SYMBOL (0-15) |
|---|---|---|---|
| 0 |   | 0 0 0 0 0 0 | 1 0 1 1 1 1 1 1 |
| 1 |   | 0 0 0 0 0 1 | 1 0 1 1 1 1 1 1 |
| 2 |   | 0 0 0 0 1 0 0 | 1 0 1 1 1 1 1 1 |
| 3 |   | 0 0 0 0 1 0 1 | 1 0 1 1 1 1 1 1 |
| 4 | 0 | 0 0 0 0 1/1/*/*/*/*/*/* | 1 0 1/1/1/1/1/1/1 |
| 5 |   | 0 0 0 1 0 0 | 1 0 0 1 1 1 1 1 |
| 6 |   | 0 0 0 1 0 1 | 1 0 0 1 1 1 1 1 |
| 7 |   | 0 0 0 1 1 0 0 | 1 0 0 1 1 1 1 1 |
| 8 |   | 0 0 0 1 1 0 1 | 1 0 0 1 1 1 1 1 |
| 9 | 1 | 0 0 0 1 1/1/*/*/*/*/*/* | 1 0 0 1/1/1/1/1/1 |
| 10 |   | 0 0 1 0 0 0 0 | 1 0 0 0 1 1 1 1 |
| 11 |   | 0 0 1 0 0 0 1 | 1 0 0 0 1 1 1 1 |
| 12 |   | 0 0 1 0 0 1 0 0 | 1 0 0 0 1 1 1 1 |
| 13 |   | 0 0 1 0 0 1 0 1 | 1 0 0 0 1 1 1 1 |
| 14 | 2 | 0 0 1 0 0 1/1/*/*/*/*/*/* | 1 0 0 0 1/1/1/1/1 |
| 15 |   | 0 0 1 0 1 0 0 | 1 0 0 0 0 1 1 1 1 |
| 16 |   | 0 0 1 0 1 0 1 | 1 0 0 0 0 1 1 1 1 |
| 17 |   | 0 0 1 0 1 1 0 0 | 1 0 0 0 0 1 1 1 1 |
| 18 |   | 0 0 1 0 1 1 0 1 | 1 0 0 0 0 1 1 1 1 |
| 19 | 3 | 0 0 1 0 1 1/1/*/*/*/*/*/* | 1 0 0 0 0 1/1/1/1 |
| 20 | 4 | 0 0 1/1/*/*/*/*/*/*/* | 1 0 0/0/0/0/0/0/0 |
| 21 |   | 0 1 0 0 0 0 | 1 1 0 1 1 1 1 1 |
| 22 |   | 0 1 0 0 0 1 | 1 1 0 1 1 1 1 1 |
| 23 |   | 0 1 0 0 1 0 0 | 1 1 0 1 1 1 1 1 |
| 24 |   | 0 1 0 0 1 0 1 | 1 1 0 1 1 1 1 1 |
| 25 | 5 | 0 1 0 0 1/1/*/*/*/*/*/* | 1 1 0 1/1/1/1/1/1 |
| 26 |   | 0 1 0 1 0 0 | 1 1 0 0 1 1 1 1 1 |
| 27 |   | 0 1 0 1 0 1 | 1 1 0 0 1 1 1 1 1 |
| 28 |   | 0 1 0 1 1 0 0 | 1 1 0 0 1 1 1 1 1 |
| 29 |   | 0 1 0 1 1 0 1 | 1 1 0 0 1 1 1 1 1 |
| 30 | 6 | 0 1 0 1 1/1/*/*/*/*/*/* | 1 1 0 0 1/1/1/1/1 |
| 31 |   | 0 1 1 0 0 0 0 | 1 1 0 0 0 1 1 1 1 |
| 32 |   | 0 1 1 0 0 0 1 | 1 1 0 0 0 1 1 1 1 |
| 33 |   | 0 1 1 0 0 1 0 0 | 1 1 0 0 0 1 1 1 1 |
| 34 |   | 0 1 1 0 0 1 0 1 | 1 1 0 0 0 1 1 1 1 |
| 35 | 7 | 0 1 1 0 0 1/1/*/*/*/*/*/* | 1 1 0 0 0 1 1 1 1 |
| 36 |   | 0 1 1 0 1 0 0 | 1 1 0 0 0 0 1 1 1 |
| 37 |   | 0 1 1 0 1 0 1 | 1 1 0 0 0 0 1 1 1 |
| 38 |   | 0 1 1 0 1 1 0 0 | 1 1 0 0 0 0 1 1 1 |
| 39 |   | 0 1 1 0 1 1 0 1 | 1 1 0 0 0 0 1 1 1 |
| 40 | 8 | 0 1 1 0 1 1/1/*/*/*/*/*/* | 1 1 0 0 0 0/1/1/1 |
| 41 | 9 | 0 1 1/1/*/*/*/*/*/* | 1 1 0/0/0/0/0/0/0 |
| 42 | 10 | 1 0 0 0 0 0 0 | 1 1 1 0 1 1 1 1 1 |

FIG. 9B

| CODEWORD NUMBER | ADDRESS | COUPLED CODEWORD 0 1 2 3 4 5 6 7 8 9 10 11 12 13 14 15 | COUPLED SYMBOL 0 1 2 3 4 5 6 7 8 9 10 11 12 13 14 15 |
|---|---|---|---|
| 43 |  | 1 0 0 0 0 0 1 | 1 1 1 0 1 1 1 1 1 |
| 44 |  | 1 0 0 0 0 1 0 0 | 1 1 1 0 1 1 1 1 1 |
| 45 |  | 1 0 0 0 0 1 0 1 | 1 1 1 0 1 1 1 1 1 |
| 46 | 10 | 1 0 0 0 0 1 1 * * * * * | 1 1 1 0 1 1 1 1 1 |
| 47 |  | 1 0 0 0 1 0 0 | 1 1 1 0 0 1 1 1 1 |
| 48 |  | 1 0 0 0 1 0 1 | 1 1 1 0 0 1 1 1 1 |
| 49 |  | 1 0 0 0 1 1 0 0 | 1 1 1 0 0 1 1 1 1 |
| 50 |  | 1 0 0 0 1 1 0 1 | 1 1 1 0 0 1 1 1 1 |
| 51 | 11 | 1 0 0 0 1 1 1 * * * * * | 1 1 1 0 0 1 1 1 1 |
| 52 |  | 1 0 0 1 0 0 0 0 | 1 1 1 0 0 0 1 1 1 |
| 53 |  | 1 0 0 1 0 0 0 1 | 1 1 1 0 0 0 1 1 1 |
| 54 |  | 1 0 0 1 0 0 1 0 0 | 1 1 1 0 0 0 1 1 1 |
| 55 |  | 1 0 0 1 0 0 1 0 1 | 1 1 1 0 0 0 1 1 1 |
| 56 | 12 | 1 0 0 1 0 0 1 1 * * * * * | 1 1 1 0 0 0 1 1 1 |
| 57 |  | 1 0 0 1 0 1 0 0 | 1 1 1 0 0 0 0 1 1 |
| 58 |  | 1 0 0 1 0 1 0 1 | 1 1 1 0 0 0 0 1 1 |
| 59 |  | 1 0 0 1 0 1 1 0 0 | 1 1 1 0 0 0 0 1 1 |
| 60 |  | 1 0 0 1 0 1 1 0 1 | 1 1 1 0 0 0 0 1 1 |
| 61 | 13 | 1 0 0 1 0 1 1 1 * * * * * | 1 1 1 0 0 0 0 1 1 |
| 62 | 14 | 1 0 0 1 1 * * * * * * | 1 1 1 0 0 0 0 0 0 |
| 63 |  | 1 0 1 0 0 0 0 | 1 1 1 1 0 1 1 1 1 |
| 64 |  | 1 0 1 0 0 0 1 | 1 1 1 1 0 1 1 1 1 |
| 65 |  | 1 0 1 0 0 1 0 0 | 1 1 1 1 0 1 1 1 1 |
| 66 |  | 1 0 1 0 0 1 0 1 | 1 1 1 1 0 1 1 1 1 |
| 67 | 15 | 1 0 1 0 0 1 1 * * * * * | 1 1 1 1 0 1 1 1 1 |
| 68 |  | 1 0 1 0 1 0 0 | 1 1 1 1 0 0 1 1 1 |
| 69 |  | 1 0 1 0 1 0 1 | 1 1 1 1 0 0 1 1 1 |
| 70 |  | 1 0 1 0 1 1 0 0 | 1 1 1 1 0 0 1 1 1 |
| 71 |  | 1 0 1 0 1 1 0 1 | 1 1 1 1 0 0 1 1 1 |
| 72 | 16 | 1 0 1 0 1 1 1 * * * * * | 1 1 1 1 0 0 1 1 1 |
| 73 |  | 1 0 1 1 0 0 0 0 | 1 1 1 1 0 0 0 1 1 |
| 74 |  | 1 0 1 1 0 0 0 1 | 1 1 1 1 0 0 0 1 1 |
| 75 |  | 1 0 1 1 0 0 1 0 0 | 1 1 1 1 0 0 0 1 1 |
| 76 |  | 1 0 1 1 0 0 1 0 1 | 1 1 1 1 0 0 0 1 1 |
| 77 | 17 | 1 0 1 1 0 0 1 1 * * * * * | 1 1 1 1 0 0 0 1 1 |
| 78 |  | 1 0 1 1 0 1 0 0 | 1 1 1 1 0 0 0 0 1 |
| 79 |  | 1 0 1 1 0 1 0 1 | 1 1 1 1 0 0 0 0 1 |
| 80 |  | 1 0 1 1 0 1 1 0 0 | 1 1 1 1 0 0 0 0 1 |
| 81 |  | 1 0 1 1 0 1 1 0 1 | 1 1 1 1 0 0 0 0 1 |
| 82 | 18 | 1 0 1 1 0 1 1 1 * * * * * | 1 1 1 1 0 0 0 0 1 |
| 83 | 19 | 1 0 1 1 1 * * * * * * | 1 1 1 1 0 0 0 0 0 |
| 84 | 20 | 1 1 * * * * * * * | 1 1 1 1 1 1 1 1 1 |

FIG. 10A

| CODE-WORD NUMBER | ADDRESS | COUPLED CODEWORD 0 1 2 3 4 5 6 7 8 9 10 11 12 13 14 15 | PACK LENGTH | BASE VALUE | NUMBER OF "1"S | SHIFT AMOUNT | COUPLED SYMBOL DATA 0 1 2 3 4 5 6 7 8 9 10 11 12 13 14 15 |
|---|---|---|---|---|---|---|---|
| 0 | 0 | 0 0 0 0 0 0 | 3 | 3 | 0 | 6 | 1 0 1 1 1 1 |
| 1 |  | 0 0 0 0 0 1 | 4 | 3 | 1 | 6 | 1 0 1 1 1 1 1 |
| 2 |  | 0 0 0 0 1 0 | 4 | 3 | 1 | 6 | 1 0 0 1 1 1 1 |
| 3 |  | 0 0 0 0 1 1 | 5 | 3 | 2 | 6 | 1 0 0 1 1 1 1 1 |
| 4 |  | 0 0 0 1 0 0 | 4 | 3 | 1 | 6 | 1 0 1 0 1 1 1 |
| 5 |  | 0 0 0 1 0 1 | 5 | 3 | 2 | 6 | 1 1 1 0 1 1 1 1 |
| 6 |  | 0 0 0 1 1 0 | 5 | 3 | 2 | 6 | 1 1 0 0 1 1 1 1 |
| 7 |  | 0 0 0 1 1 1 | 6 | 3 | 3 | 6 | 1 1 0 0 1 1 1 1 1 |
| 8 |  | 0 0 1 0 0 0 | 5 | 5 | 0 | 7 | 1 0 1 1 1 1 1 1 |
| 9 |  | 0 0 1 0 0 1 | 6 | 5 | 1 | 7 | 1 0 1 1 1 1 1 1 1 |
| 10 |  | 0 0 1 0 1 0 | 6 | 5 | 1 | 7 | 1 0 0 1 1 1 1 1 1 |
| 11 |  | 0 0 1 0 1 1 | 7 | 5 | 2 | 7 | 1 0 0 1 1 1 1 1 1 1 |
| 12 |  | 0 0 1 1 0 0 | 6 | 5 | 1 | 7 | 1 1 1 0 1 1 1 1 1 |
| 13 |  | 0 0 1 1 0 1 | 7 | 5 | 2 | 7 | 1 1 1 0 1 1 1 1 1 1 |
| 14 |  | 0 0 1 1 1 0 | 7 | 5 | 2 | 7 | 1 1 0 0 1 1 1 1 1 1 |
| 15 |  | 0 0 1 1 1 1 | 8 | 5 | 3 | 7 | 1 1 0 0 1 1 1 1 1 1 1 |
| 16 | 2 | 0 * 1 1 1 1 1 1 1 1 # # # # # # | EOB | 64 | 0 | 10 | 1 0 1 1 1 1 1 1 1 1 |
| 17 |  | 0 1 0 0 0 0 0 0 0 0 # # # # # # | 3+n | 3 | 0+n' | 12 | 1 0 0 0 1 1 1 1 1 1 1 1 |
| 18 |  | 0 1 0 0 0 0 0 0 0 1 # # # # # # | 4+n | 3 | 1+n' | 12 | 1 0 0 0 1 1 1 1 1 1 1 1 |
| 19 |  | 0 1 0 0 0 0 0 0 1 0 # # # # # # | 4+n | 3 | 1+n' | 12 | 1 0 0 0 0 1 1 1 1 1 1 1 |
| 20 |  | 0 1 0 0 0 0 0 0 1 1 # # # # # # | 5+n | 3 | 2+n' | 12 | 1 0 0 0 0 1 1 1 1 1 1 1 1 |
| 21 | 3 | 0 1 0 0 0 1 | 5 | 5 | 0 | 7 | 1 0 0 0 1 1 1 1 |
| 22 |  | 0 1 0 0 1 0 | 6 | 5 | 1 | 7 | 1 0 0 0 1 1 1 1 1 |
| 23 |  | 0 1 0 0 1 1 | 6 | 5 | 1 | 7 | 1 0 0 0 0 1 1 1 1 |
| 24 |  | 0 1 0 1 0 0 | 7 | 5 | 2 | 7 | 1 0 0 0 0 1 1 1 1 1 |
| 25 | 4 | 0 1 0 1 0 1 | 6 | 5 | 1 | 7 | 1 1 0 0 0 1 1 1 1 |

FIG. 10B

| CODE-WORD NUMBER | ADD-RESS | COUPLED CODEWORD 0 1 2 3 4 5 6 7 8 9 10 11 12 13 14 15 | PACK LENGTH | BASE VALUE | NUMBER OF "1"S | SHIFT AMOUNT | COUPLED SYMBOL DATA 0 1 2 3 4 5 6 7 8 9 10 11 12 13 14 15 |
|---|---|---|---|---|---|---|---|
| 26 | 4 | 0 1 1 0 0 1 | 7 | 5 | 2 | 7 | 1 1 0 0 0 1 1 1 1 |
| 27 |  | 0 1 1 0 1 0 | 7 | 5 | 2 | 7 | 1 1 0 0 0 1 1 1 1 |
| 28 |  | 0 1 1 0 1 1 | 8 | 5 | 3 | 7 | 1 1 0 0 0 1 1 1 1 1 |
| 29 |  | 0 0 1 1 0 0 0 | 7 | 7 | 0 | 8 | 1 0 0 0 1 0 1 1 1 |
| 30 |  | 0 0 1 1 0 0 1 | 8 | 7 | 1 | 8 | 1 0 0 0 1 0 1 1 1 1 |
| 31 |  | 0 0 1 1 0 1 0 | 8 | 7 | 1 | 8 | 1 0 0 0 1 0 1 1 1 1 |
| 32 |  | 0 0 1 1 0 1 1 | 9 | 7 | 2 | 8 | 1 0 0 0 1 0 1 1 1 1 1 |
| 33 |  | 0 0 1 1 1 0 0 | 8 | 7 | 1 | 8 | 1 1 0 0 0 1 1 1 1 |
| 34 |  | 0 0 1 1 1 0 1 | 9 | 7 | 2 | 8 | 1 1 0 0 0 1 1 1 1 1 |
| 35 | 5 | 0 0 1 1 1 1 0 | 9 | 7 | 2 | 8 | 1 1 0 0 0 1 1 1 1 1 |
| 36 | 6 | 0 0 1 1 1 1 1 | 10 | 7 | 3 | 8 | 1 1 0 0 0 1 1 1 1 1 1 |
| 37 |  | 0 * 1 1 0 1 1 * | EOB | 64 |  | 11 |  |
| 38 |  | 0 0 0 1 0 0 0 # # # # | 5+n | 5 | 0+n | 13 | 1 0 0 1 0 1 1 1 1 |
| 39 |  | 0 0 0 1 0 0 1 # # # # | 6+n | 5 | 1+n | 13 | 1 0 0 1 0 1 1 1 1 1 |
| 40 |  | 0 0 0 1 0 1 0 # # # # | 6+n | 5 | 1+n | 13 | 1 0 0 1 0 1 1 1 1 1 |
| 41 |  | 0 0 0 1 0 1 1 # # # # | 7+n | 5 | 2+n | 13 | 1 0 0 1 0 1 1 1 1 1 1 |
| 42 |  | 0 0 * 1 1 1 1 * | EOB | 64 |  | 8 |  |
| 43 |  | 0 0 1 1 1 0 0 0 # # | 2+n | 2 | 0+n | 10 | 1 0 0 0 1 1 1 1 1 1 |
| 44 | 9 | 0 0 1 1 1 0 0 1 # # | 3+n | 2 | 1+n | 10 | 1 1 0 0 0 1 1 1 1 1 |
| 45 |  | 1 0 0 0 0 | 5 | 5 | 0 | 7 | 1 1 1 0 1 1 1 1 1 |
| 46 |  | 1 0 0 0 1 | 6 | 5 | 1 | 7 | 1 1 1 0 0 1 1 1 1 1 |
| 47 |  | 1 0 0 1 0 | 6 | 5 | 1 | 7 | 1 1 1 0 0 1 1 1 1 1 |
| 48 |  | 1 0 0 1 1 | 7 | 5 | 2 | 7 | 1 1 1 1 0 1 1 1 1 1 1 |
| 49 |  | 1 0 1 0 0 | 6 | 5 | 1 | 7 | 1 1 1 1 0 1 1 1 1 1 |
| 50 | 10 | 1 0 1 0 1 | 7 | 5 | 2 | 7 | 1 1 1 1 0 1 1 1 1 1 1 |

FIG. 10C

| CODEWORD NUMBER | ADDRESS | COUPLED CODEWORD (0-15) | PACK LENGTH | BASE VALUE | NUMBER OF "1"S | SHIFT AMOUNT | COUPLED SYMBOL DATA (0-15) |
|---|---|---|---|---|---|---|---|
| 51 | 10 | 1 1 0 1 0 | 7 | 5 | 2 | 7 | 1 1 1 0 0 1 1 1 1 |
| 52 |  | 1 1 0 1 1 | 8 | 5 | 3 | 7 | 1 1 1 0 0 1 1 1 1 |
| 53 |  | 1 1 0 0 0 0 0 | 7 | 7 | 0 | 8 | 1 1 1 0 1 1 1 1 1 |
| 54 |  | 1 1 0 0 0 0 1 | 8 | 7 | 1 | 8 | 1 1 1 0 1 1 1 1 1 |
| 55 |  | 1 1 0 0 0 1 0 | 8 | 7 | 1 | 8 | 1 1 1 0 0 1 1 1 1 |
| 56 |  | 1 1 0 0 0 1 1 | 9 | 7 | 2 | 8 | 1 1 1 0 0 1 1 1 1 |
| 57 |  | 1 1 0 0 1 0 0 | 8 | 7 | 1 | 8 | 1 1 1 0 1 1 1 1 1 |
| 58 |  | 1 1 0 0 1 0 1 | 9 | 7 | 2 | 8 | 1 1 1 0 0 1 1 1 1 |
| 59 |  | 1 1 0 0 1 1 0 | 9 | 7 | 2 | 8 | 1 1 1 0 0 1 1 1 1 |
| 60 | 11 | 1 1 0 0 1 1 1 | 10 | 7 | 3 | 8 | 1 1 1 0 0 0 1 1 1 |
| 61 | 12 | 1 1 0 * * | EOB | 64 | — | 11 | 1 1 1 1 1 1 1 1 1 1 1 |
| 62 | 13 | 1 1 0 0 1 1 1 0 # # # # # # # # | 5+n | 5 | 0+n | 13 | 1 1 1 0 1 1 1 1 1 |
| 63 |  | 1 1 0 0 1 1 1 0 # # # # # # # # | 6+n | 5 | 1+n | 13 | 1 1 1 0 0 1 1 1 1 |
| 64 |  | 1 1 0 0 1 1 1 0 # # # # # # # # | 6+n | 5 | 1+n | 13 | 1 1 1 0 0 1 1 1 1 |
| 65 |  | 1 1 0 0 1 1 1 1 # # # # # # # # | 7+n | 5 | 2+n | 13 | 1 1 1 0 0 0 1 1 1 |
| 66 | 14 | 1 1 1 0 0 0 0 | 7 | 7 | 0 | 8 | 1 1 1 0 1 1 1 1 1 |
| 67 |  | 1 1 1 0 0 0 1 | 8 | 7 | 1 | 8 | 1 1 1 0 0 1 1 1 1 |
| 68 |  | 1 1 1 0 0 1 0 | 8 | 7 | 1 | 8 | 1 1 1 0 0 0 1 1 1 |
| 69 |  | 1 1 1 0 0 1 1 | 9 | 7 | 2 | 8 | 1 1 1 0 0 0 0 1 1 |
| 70 |  | 1 1 1 0 1 0 0 | 8 | 7 | 1 | 8 | 1 1 1 0 0 0 1 1 1 |
| 71 |  | 1 1 1 0 1 0 1 | 9 | 7 | 2 | 8 | 1 1 1 0 0 0 0 1 1 |
| 72 |  | 1 1 1 0 1 1 0 | 9 | 7 | 2 | 8 | 1 1 1 0 0 0 0 1 1 |
| 73 |  | 1 1 1 0 1 1 1 | 10 | 7 | 3 | 8 | 1 1 1 0 0 0 0 0 1 |
| 74 | 15 | 1 1 1 1 0 0 1 0 | 9 | 9 | 0 | 9 | 1 1 1 1 0 1 1 1 1 |
| 75 |  | 1 1 1 1 0 0 1 1 | 10 | 9 | 1 | 9 | 1 1 1 1 0 0 1 1 1 |

FIG. 10D

| CODE-WORD NUMBER | ADDRESS | COUPLED CODEWORD 0 1 2 3 4 5 6 7 8 9 10 11 12 13 14 15 | PACK LENGTH | BASE VALUE | NUMBER OF "1"S | SHIFT AMOUNT | COUPLED SYMBOL DATA 0 1 2 3 4 5 6 7 8 9 10 11 12 13 14 15 |
|---|---|---|---|---|---|---|---|
| 76 |    | 1 1 0 0 1 1 0 0 0 | 10 | 9 | 1 | 9 | 1 1 1 1 0 0 0 0 1 1 |
| 77 |    | 1 1 0 0 1 1 0 0 1 | 11 | 9 | 2 | 9 | 1 1 1 1 0 0 0 0 1 1 1 |
| 78 |    | 1 1 0 1 1 1 0 1 0 | 10 | 9 | 1 | 9 | 1 1 1 1 1 0 0 0 0 1 |
| 79 |    | 1 1 0 1 1 1 0 1 0 1 | 11 | 9 | 2 | 9 | 1 1 1 1 1 0 0 0 0 1 1 |
| 80 |    | 0 1 1 1 1 1 1 1 0 | 11 | 9 | 2 | 9 | 1 1 1 1 1 1 0 0 0 0 1 |
| 81 | 15 | 1 1 0 1 1 1 0 1 0 1 | 11 | 9 | 2 | 9 | 1 1 1 1 1 1 0 0 0 0 1 |
| 82 | 16 | 1 1 0 * 1 1 0 1 1 0 0 0 | EOB | 64 | 3 | 12 | 1 1 1 1 1 1 1 0 0 0 0 1 |
| 83 |    | 1 1 0 0 1 1 0 1 1 # # # # # | 7+n | 7 | 0+n | 14 | 1 1 1 1 0 0 0 0 0 0/0/0 |
| 84 |    | 1 1 0 0 1 1 0 1 1 # # # # # | 8+n | 7 | 1+n | 14 | 1 1 1 1 0 0 0 0 0 0/0/0 |
| 85 |    | 1 1 0 1 1 1 0 1 1 # # # # # | 8+n | 7 | 1+n | 14 | 1 1 1 1 1 0 0 0 0 0/0/0 |
| 86 | 17 | 1 1 0 1 1 1 0 1 1 # # # # # | 9+n | 7 | 2+n | 14 | 1 1 1 1 1 0 0 0 0 0/0/0 |
| 87 | 18 | 1 1 0 * 1 1 0 0 0 | EOB | 64 | 0+n | 9 | 1 1 1 1 0 0 0 0 0/0/0 |
| 88 |    | 1 1 0 0 1 1 1 1 1 # # # | 4+n | 4 | 0+n | 11 | 1 1 1 1 0/0/0/0/0/0 |
| 89 | 19 | 1 1 0 1 1 1 1 1 1 # # # | 5+n | 4 | 1+n | 11 | 1 1 1 1 1 0/0/0/0/0/0 |
| 90 | 20 | 1 1 1 0 0 0 | EOB | 64 |    | 6 | 1 1/1/0/0/0/0/0/0 |
| 91 | 21 | 1 1 # # # # # # # | 1+n | 1 | 0+n | 8 | 1/1/1/1/1/1/1/1 |

FIG. 11
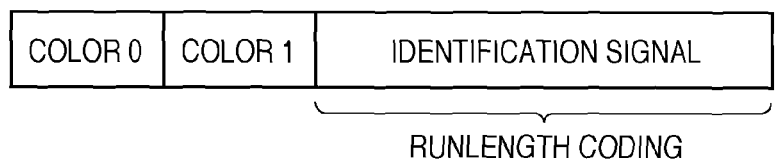
FIG. 12A    FIG. 12B
FIG. 13
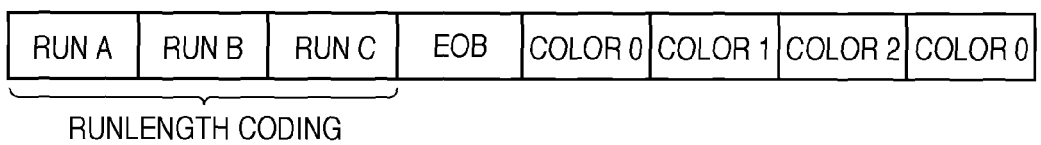

DECODING APPARATUS AND CONTROL METHOD THEREOF

BACKGROUND OF THE INVENTION

1. Field of the Invention

The present invention relates to a technique for decoding coded data.

2. Description of the Related Art

Proposals for speeding up decoding processing of variable length coded data have been made. As one of these proposals, a proposal which comprises a normal symbol decoder and a decoder for specific symbols having high frequencies of occurrence, and simultaneously decodes two symbols when a codeword hits a specific symbol is available (for example, Japanese Patent Laid-Open No. 2003-174365). According to this technique, a maximum of two symbols can be decoded per clock cycle.

Also, the following variable length decoder has been proposed (Japanese Patent Laid-Open No. 9-284142). With this decoder, tables and barrel shifters in a number as large as the number of bits of a maximum code length are prepared, and one decode symbol is selected from outputs as many as the number of bits of a longest codeword to skip feedback from a Huffman decoder to the barrel shifters, thus assuring a high-speed operation.

With the aforementioned related art, when a codeword hits a specific symbol, two symbols can be decoded per clock cycle to achieve a high throughput, as described above. However, when a codeword does not hit, only one symbol can be decoded per clock cycle, and a high throughput cannot always be achieved. In variable length coding such as a Huffman decoder of JPEG, the coding speed depends on a code size, and a decode speed of a predetermined unit cannot be guaranteed in the related art.

In the related art, the numbers of tables and barrel shifters are as very large as the number of bits of a maximum code length, resulting in an increase in circuit scale. In order to achieve a high throughput, a plurality of symbols have to be simultaneously decoded. However, in order to simultaneously decode a plurality of symbols, the number of bits of the maximum code length increases to multiples of the number of symbols to be simultaneously decoded, and the number of tables required to simultaneously decode a plurality of symbols increases to a value corresponding to the number of symbols to the (number of symbols to be simultaneously decoded)-th power, thus considerably increasing the circuit scale.

SUMMARY OF THE INVENTION

The present invention has been made in consideration of the aforementioned problems. The present invention provides a technique that can attain high-speed decoding. Also, the present invention provides a technique that can attain both a further reduction of the circuit scale, and simultaneous decoding of a plurality of symbols.

In order to solve the aforementioned problems, a decoding apparatus according to the present invention comprises, for example, the following arrangement.

That is, there is provided a decoding apparatus for decoding coded data generated by executing variable length coding to have a pixel block including a plurality of pixels (the number of pixels N) as a unit, wherein letting P (bits) be a code size of the pixel block, T (pixels/clock cycle) be a target throughput, x (bits/clock cycle) be a code size to be processed per clock cycle, and y (pixels/clock cycle) be the number of pixels to be processed per clock cycle, at least either of:

$$x \geq (P/N) \times T$$

and $$y \geq T$$

is satisfied.

According to the present invention, the number of processing cycles at the time of decoding can be limited to a predetermined value or less, and a decoding processing speed can be guaranteed. Hence, the need for a buffer required to smooth processing speeds can be obviated, and a throughput exceeding "2" can be guaranteed.

Further features of the present invention will become apparent from the following description of exemplary embodiments (with reference to the attached drawings).

BRIEF DESCRIPTION OF THE DRAWINGS

FIG. 1 is a code table of single symbols according to the first and second embodiments;

FIG. 2 is a decode table according to the first embodiment;

FIG. 4 is a table for explaining the operations of a decoder and table for coupled symbol data according to the first embodiment;

FIG. 5 is a table for explaining the operations of a decoder and tables for a shift amount and pack length according to the first embodiment;

FIG. 6 is a table for explaining the operation of a packer according to the first embodiment;

FIGS. 7A and 7B show a decode table according to the second embodiment;

FIG. 8 is a block diagram showing the arrangement of a decoding apparatus according to the second embodiment;

FIGS. 9A and 9B are tables for explaining the operations of a decoder and table for coupled symbol data according to the second embodiment;

FIGS. 10A to 10D are tables for explaining the operations of a decoder and tables for a shift amount and pack length according to the second embodiment;

FIG. 11 is a view showing a format example of coded codes according to the third embodiment;

FIGS. 12A and 12B are views showing an input example of multi-color data according to the third embodiment;

FIG. 13 is a view showing a format example of coded codes of multi-color data according to the third embodiment;

DESCRIPTION OF THE EMBODIMENTS

Embodiments according to the present invention will be described in detail hereinafter with reference to the accompanying drawings.

A decoding target of an image decoding apparatus of this embodiment is coded data of a binary image (1 pixel=1 bit). Then, the image decoding apparatus sequentially decodes coded data to have a pixel block including a plurality of pixels (8×8 pixels in this embodiment) as a unit.

Prior to a description of the image decoding apparatus according to this embodiment, coded data generation processing by an image encoding apparatus will be described.

The image encoding apparatus runlength-codes binary image data for respective 8×8 pixel blocks. Assume that a coding target is binary image data scanned by an image scanner. Alternatively, a non-compressed binary image data file on a network or binary image data processed by a computer may be used as a coding target, and the types of input sources are not particularly limited. In case of a binary image, when pixels in an 8×8 pixel block are raster-scanned, runs of a pixel value "1" and those of a pixel value "0" alternately appear by necessity. Therefore, when a start pixel value of the block is decided, a first runlength codeword indicates a run of that pixel value, and a codeword of the subsequent run becomes that indicating a pixel value by logically exclusive ORing the pixel value indicated by the immediately preceding run by "1".

FIG. 1 shows the correspondence between runlength codewords and runlengths. That is, when a runlength is "0" (in case of only one pixel having the same value), the image encoding apparatus outputs a 2-bit codeword "00". When a runlength is "1" (in case of a run of two pixels having the same value), the apparatus outputs a 2-bit codeword "01". When a runlength is "2" (in case of a run of three pixels having the same value) or "3" (in case of a run of four pixels having the same value), the apparatus outputs a 3-bit codeword, as shown in FIG. 1. When runlengths range from "4" to "63" (in case of runs of five to 64 pixels having the same value), the apparatus outputs 8-bit fixed codewords "11000100" to "11111111", as shown in FIG. 1. In this embodiment, since encoding is done to have an 8×8 pixel block as a unit, a runlength never exceeds 63.

When the pixel values from a certain pixel to the last pixel are the same and its runlength is "4" or more during coding of a block of interest, the image encoding apparatus does not generate a codeword of that run, and outputs a 6-bit codeword "110000" as a codeword indicating the end of coded data (EOB; End Of Block). If a pixel value of a run immediately before the codeword indicating the EOB is "1", it is assured that pixels having a value "0" run from a pixel immediately after that pixel to the last pixel. Also, since the codeword "110000" of this EOB does not match any of codewords of the runlengths=4 to 63, a decoding apparatus can detect the EOB.

Figure 15A:
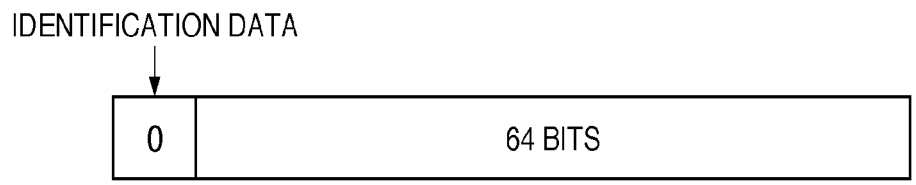
FIGS. 15A and 15B are views showing the data structure of coded data of one pixel block.

A coded data size obtained by coding binary image data for one block may often exceed 64 bits. Normally, since 8×8 pixels in the binary image are configured by 64 bits, such coded data size is not a compressed size. Hence, when coded data of one block exceeds 64 bits, the image encoding apparatus discards that coded data, outputs, as a start bit, 1-bit identification data "0" indicating that the subsequent data is not coded, and then outputs data of 64 pixels (64 bits) intact. FIG. 15A shows the data structure of coded data in this case.

On the other hand, when a coded data size of one block is less than 64 bits, the image encoding apparatus outputs, as a start bit, 1-bit identification data indicating that the subsequent data is coded, and then outputs 1 bit used to decide a start pixel value.

Figure 15B:
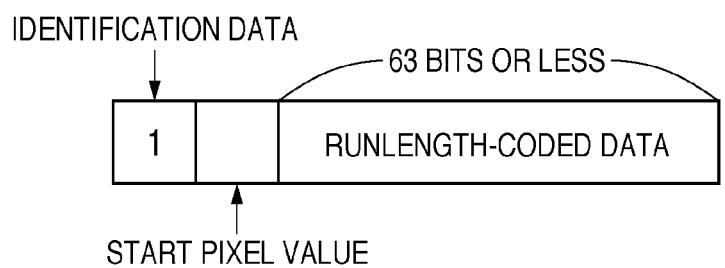

After that, the apparatus outputs coded data. FIG. 15B shows the data structure of coded data in this case.

Figure 3:
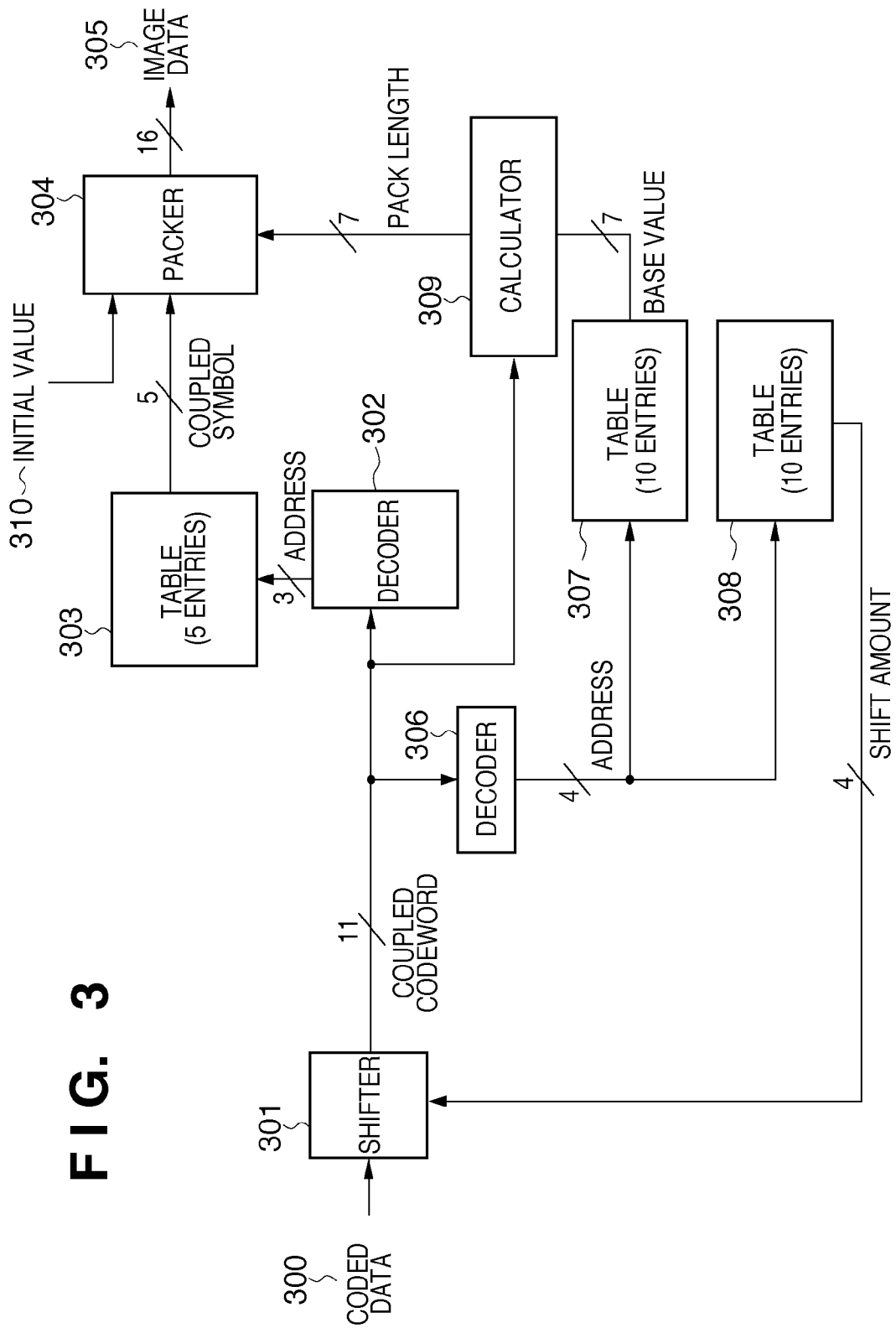
FIG. 3 is a block diagram showing the arrangement of a decoding apparatus according to the first embodiment.
Figure 14:
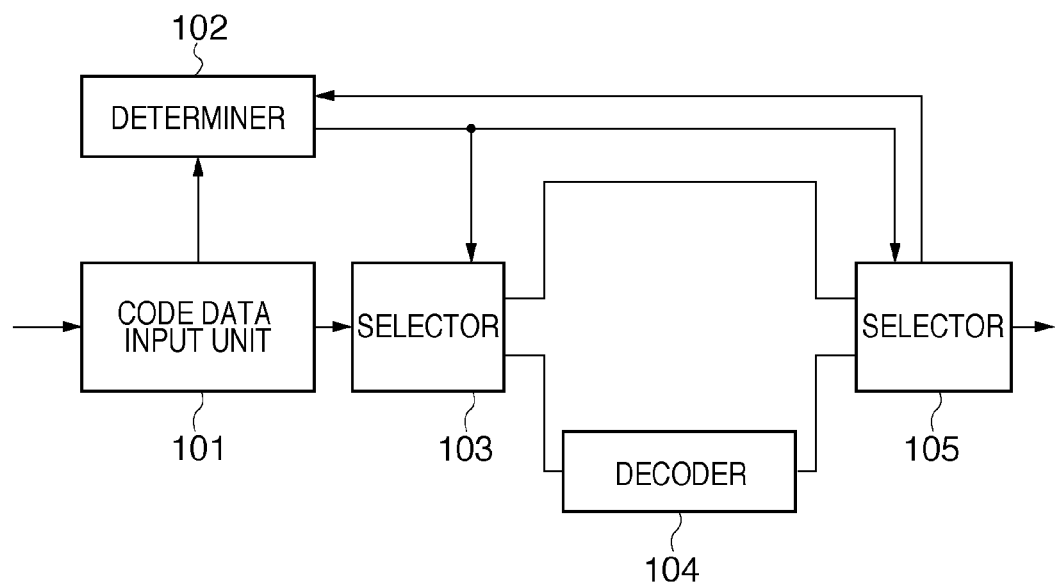
FIG. 14 is a block diagram showing the arrangement of an image decoding apparatus according to an embodiment.

The overview of the generation processing of coded data to be decoded in this embodiment has been explained. FIG. 14 is a block diagram showing the arrangement of an image decoding apparatus according to this embodiment. As shown in FIG. 14, this apparatus includes a code data input unit 101, determiner 102, selectors 103 and 105, and decoder 104. FIG. 3 is a block diagram showing the arrangement of the decoder 104.

The decoder 104 has a shifter 301 which detects a start bit of a codeword from coded data, a table 303 which serves as a first table for storing decode values of a plurality of symbol data at one address, a table 308 which serves as a second table for storing a shift amount of the shifter, a table 307 which serves as a third table for generating a data length of the decode values of the plurality of symbol data, a decoder 302 which serves as a first decoder (or a first decode step) for generating an address of the first table from the coded data, a decoder 306 which serves as a second decoder (or a second decode step) for generating an address of the second and third tables from the coded data, and a packer 304 which serves as an output unit for coupling or separating the decode values of the plurality of symbol data to data as many as the predetermined fixed number of bits. Respective components will be described in detail below.

The code data input unit 101 includes a buffer memory. The code data input unit 101 sequentially inputs a bitstream of coded data, and outputs that bitstream to the selector 103.

The determiner 102 determines a start identification bit of coded data for one block, and is active in an initial stage. Then, the determiner 102 determines if one start bit of coded data is "0" or "1". That is, the determiner 102 determines whether the coded data of a block of interest is data shown in FIG. 15A or 15B, and outputs a control signal (which can be 1 bit) as the determination result to the selectors 103 and 105.

As a result, when the determiner 102 determines that the block of interest is coded data shown in FIG. 15A, the selector 103 outputs 64 bits except for the start identification bit intact to the selector 105. The selector 105 outputs the input 64-bit data as a decode result. Therefore, when the identification bit of the block of interest is "0", the selector 105 can output 64-bit data as a decode result in one clock cycle.

Note that the selector 105 counts the number of binary pixels which form one block, and outputs, to the determiner 102, a control signal for activating the determiner 102, so as to execute decode processing of the next pixel block every time decoding of 64 pixels which form one block is complete.

On the other hand, when the determiner 102 determines that the start identification bit of the coded data of a block of interest is "1", i.e., the block of interest is coded data shown in FIG. 15B, it outputs, to the selector 103, a control signal for controlling the selector 103 to supply coded data except for the start identification bit to the decoder 104. Also, the determiner 102 outputs, to the selector 105, a control signal for controlling the selector 105 to select data from the decoder 104. The selector 105 counts binary pixel data output from the decoder 104 (for respective 16-bit units, as will be described in detail later), and outputs a control signal for activating the determiner 102 when it determines that output of 64 pixels is complete, so as to execute decode processing of the next pixel block. Therefore, during the decode processing of 64 pixels by the decoder 104, the determiner 102 is inactive, and the selector 103 keeps outputting the coded data from the code data input unit 101 to the decoder 104.

As can be easily understood from the above description, coded data with the structure shown in FIG. 15A can be decoded in one clock cycle. Then, the decoder 104 which decodes coded data having the data structure shown in FIG. 15B will be described in more detail below.

The decoder 104 of the image decoding apparatus of this embodiment decodes coded data of one block in 16 clock cycles at a maximum. In other words, it is guaranteed for designers who design MFPs, printers, and the like that use (incorporate) the image encoding apparatus of this embodiment that this apparatus decodes four pixels at a minimum per clock cycle.

An index of a throughput based on which the decoding apparatus according to the first and second embodiments (to be described later) guarantees a speed will be described below.

It should be noted that it is assured that a data size of coded data except for a value (1 bit) of one start pixel of a block in coded data to be decoded by the decoder 104 in this embodiment is less than 64 bits (see FIG. 15B).

Let N be the number of pixels of a processing unit (block in this case) (N=64 in this embodiment). Also, let P (bits) be the coded data size for one block. Let T (pixels/clock cycle) be a target throughput (4 pixels/clock cycle in this embodiment).

In this case, P/N represents an average code size per pixel. Therefore, in order to satisfy the target throughput T, a codeword of (P/N) x T bits of the P bits can be decoded per clock cycle.

On the other hand, since the target throughput is T pixels/clock cycle, it can be achieved when T pixels or more are processed per clock cycle.

Hence, letting x (bits/clock cycle) be a code size to be processed per clock cycle, and y (pixels/clock cycle) be the number of pixels to be processed per clock cycle, in order to satisfy the target throughput=T pixels/clock cycle, either of:

$$x \geq (P/N) \times T \quad (1)$$

or $$y \geq T \quad (2)$$

need only be satisfied.

First Embodiment

The code size of one block to be decoded by the decoder 104 is P (less than 64 bits). Therefore, in order to decode four pixels per clock cycle, from inequality (1) above, we have:

$$x \geq (P/64) \times 4 > 64/64 \times 4 = 4$$

Hence, a codeword having a length of 4 bits or more need only be decoded per clock cycle. On the other hand, as shown in FIG. 1, when codewords (those of 2 bits or 3 bits) having a length less than 4 bits are included, and they are decoded in one clock cycle, the aforementioned condition is not met. Thus, a codeword having a length less than 4 bits is coupled to the next codeword to apparently form a codeword exceeding 4 bits, and that codeword is decoded. In other words, single codewords of 4 bits or more are not coupled. A codeword formed by coupling two codewords will be referred to as a coupled codeword hereinafter. In order to distinguish an original codeword or each individual codeword which forms a coupled codeword from the coupled codeword, such codeword will be referred to as a single codeword hereinafter.

For the sake of easy understanding of the decode processing of this embodiment, a decode table shown in FIG. 2 will be explained. In FIG. 2, "coupled codeword" is formed by coupling a plurality of codewords, as described above. Also, "coupled symbol" indicates decode values of a plurality of symbols when a decode value of an immediately preceding pixel is "0" (to be referred to as coupled symbol data hereinafter). For the descriptive convenience, a codeword number is assigned to each coupled codeword.

As shown in FIG. 2, a coupled codeword of a codeword number "0" indicates a case in which two single codewords "00" successively appear, and coupled symbol data "10" upon decoding them. A codeword "00" indicates a run-length=0 (a case of only one pixel having the same value). Since FIG. 2 assumes an example in which immediately preceding coded data is "0", the decode result obtained when two single codewords "00" successively appear is "10". That is, when a coupled codeword "0000" is decoded, its decode result includes two pixels whose values appear in the order of "1" and "0".

A coupled codeword of a codeword number "1" indicates a case in which single codewords "00" and "01" are to be successively decoded, and decoded coupled symbol data is "100". That is, when a coupled codeword "0001" is decoded, its decode result includes three pixels, i.e., one pixel having a value "1" is generated, and two pixels having a value "0" are then generated.

A coupled codeword of a codeword number "2" indicates a case in which single codewords "00" and "100" are to be successively decoded, and decoded coupled symbol data is "1000" (four pixels are decoded). A coupled codeword of a codeword number "3" indicates a case in which single codewords "00" and "101" are to be successively decoded, and decoded coupled symbol data is "10000" (five pixels are decoded).

Furthermore, a coupled codeword of a codeword number "4" indicates a case in which single codewords "00" and "11****" ("****" ranges from "000100" ("4" as a decimal number) to "111110" ("62" as a decimal number)) are to be successively decoded, and decoded coupled symbol data becomes that in which five to 63 "0"s continuously appear after one "1".

With the same method, FIG. 2 enumerates combinations when single codewords "00", "01", "100", "101", and "11****" respectively appear as two successive single codewords which form coupled symbol data. However, at a codeword number "20", a coupled codeword includes only a single codeword "11****".

As exceptional processing (not shown), when a single codeword EOB (a single codeword "110000" shown in FIG. 1) appears in the middle of a coupled codeword, coupled symbol data is output to have "1" for all the remaining pixels in one block when the decode value of an immediately preceding symbol is "0". Also, coupled symbol data is output to have "0" for all the remaining pixels in one block when the decode value of an immediately preceding symbol is "1".

Furthermore, when the single codeword EOB appears as a start codeword of a coupled codeword (when a coupled codeword itself is an EOB), a result obtained by logically exclusive ORing the immediately preceding pixel value by "1" is output up to the last pixel. Since the table in FIG. 2 assumes that the immediately preceding pixel data is "0", all "1"s are output.

In the decode table in FIG. 2, all the coupled codewords are set to have a code length of 4 bits or more. Therefore, the code size x to be processed per clock cycle is 4 bits or more. Since it is assured that the code size P of a block of interest to be decoded by the decoder 104 is less than 64 bits, and coded data for one block is decoded by processing codewords of 4 bits or more per clock cycle, 64/4=16, and the decode processing of the block of interest is completed in 16 clock cycles at a maximum. That is, upon externally viewing this decoder 104, it executes processing which satisfies the target throughput T=4 pixels/clock cycle.

In the table in FIG. 2, a bit "*" can be either "0" or "1", the number of address entries is nonnegligibly large. Since the number of bits of coupled symbols stored at each address requires 63 bits at a maximum, the memory size required to build that table is large.

Hence, in the first embodiment, an example in which the memory size required for the apparatus is further reduced will be explained.

FIG. 3 is a block diagram showing the arrangement of the decoder 104 according to this embodiment.

Referring to FIG. 3, reference numeral 300 denotes an input terminal which inputs coded data from the selector 103; and 301, a shifter which detects a start coupled codeword from the coded data. Reference numeral 302 denotes a decoder which decodes a coupled codeword and outputs an address to a decode table 303 (to be described later); and 303, a table required to implement the decode table shown in FIG. 2. Reference numeral 304 denotes a packer which packs decoded coupled symbol data for respective 16-bit units; and 305, an output terminal which outputs 16-bit packed pixel data. Reference numeral 306 denotes a decoder which decodes a coupled codeword and supplies an address to tables 307 and 308 (to be described below). The table 307 is used to output an offset value (to be referred as a base value hereinafter) required to calculate a data length (to be referred to as a pack length hereinafter) indicating the number of decoded pixels. The table 308 is used to output a shift amount required to detect a start codeword of the coded data.

Reference numeral 309 denotes a calculator which calculates a pack length using the base value from the table 307 and a plurality of coded data; and 310, a 1-bit input terminal which inputs a first pixel value (initial value) of a block.

The operation of the decoding apparatus shown in FIG. 3 will be described below. Coded data input from the input terminal 300 is supplied to the decoders 302 and 306 via the shifter 301. In the example of FIG. 2, since the maximum number of bits of a coupled codeword is 11 bits, coded data for 11 bits is supplied to the decoders 302 and 306. The decoder 302 decodes a coupled codeword in FIG. 2, and outputs the decode result as a table address to the table 303.

Note that the table 303 requires 21 coupled codewords shown in FIG. 2. However, in the first embodiment, the number of table entries is reduced to five, and the circuit scales of the decoder 302 and table 303 are reduced, as will be described later. After that, the table 303 outputs coupled symbol data to the packer 304 according to the address from the decoder 302. Note that coupled symbol data to be output from the table 303 is stored until the next pixel of the last change point since the position of the last change point (a boundary bit position between two runs) and the next pixel value need only be detected, as will be described later. That is, since each of coupled symbol data corresponding to codeword numbers "15" to "19" in FIG. 2 has a maximum bit width, each coupled symbol data is output to the packer 304 to have a 5-bit bus width as the next pixel of the last change point at that time.

On the other hand, the decoder 306 decodes a coupled codeword in FIG. 2 from the input coded data, and outputs the decode result as a table address to the tables 307 and 308. Note that the table 307 normally requires the number of entries as many as the number of coupled codewords shown in FIG. 2. However, in the first embodiment, the number of entries is reduced to 10, thus reducing the circuit scales of the decoder 306, and tables 307 and 308, as will be described later.

As will be described later with reference to FIG. 5, since predetermined bits of a coupled codeword are used to calculate a shift amount, the calculator 309 receives a coupled codeword output from the shifter 301. After that, the table 307 outputs a base value to the calculator 309 according to the address from the decoder 306. The calculator 309 calculates a pack length using the sum total of the base value and values at predetermined bit positions of a coupled codeword, and outputs the calculated pack length to the packer 304, as will be described later.

The table 308 outputs a shift amount to the shifter 301 according to the address from the decoder 306. Then, the packer 304 generates single symbol data of the last codeword in coupled symbol data (to be referred to as last single symbol data hereinafter) in accordance with the pack length and the initial value of a block input from the input terminal 310, and outputs 16-bit packed pixel data to the output terminal 305. The shifter 301 detects the next coupled codeword according to the shift amount. By repeating the aforementioned operations, the decode operation is attained.

The operations of the decoder 302 and table 303 will be described below with reference to FIG. 4. The codeword numbers and coupled codewords are the same as those in FIG. 2. Differences are that address values of the decoder 302 are added, and each coupled symbol data is extended to the 4th bit. For example, coupled symbol data of the codeword number "0" in FIG. 2 is "10". However, in FIG. 4, a decode value "0" of the second symbol as that of a last single symbol is extended to obtain coupled symbol data "10000". This is for the following reason. That is, since the subsequent packer 304 decides a bit width of coupled symbol data using the pack length indicating the number of decoded pixels, and can decide the value of the coupled symbol data if the start position of a decode value of a last single symbol can be detected, the bus width is adjusted to 5 bits of a coupled codeword (each of the codeword numbers "15" to "19") having the farthest start position of the decode value of the last single symbol. More specifically, since coding used in this embodiment is runlength coding, data can be decoded as long as an initial value and change point can be detected. Also, since the same value successively appears after the last change point, a bit sequence including the last change point, i.e., the farthest start position of a decode value of a last single symbol is held as a table, and values after the last bit can be handled so that the same value as the last bit successively appears. With this operation, by assigning the address output from the decoder 302 to data that yield identical coupled symbol data, 21 entries originally required in FIG. 2 can be reduced to five entries. In this manner, the circuit scales of the decoder 302 and table 303 are reduced.

The operations of the decoder 306 and the tables 307 and 308 will be described below with reference to FIG. 5. In order to identify a single codeword, one or two start bits (to be referred to as a header hereinafter) of each single codeword are defined as follows:

a header of each of single codewords "00" and "01" is "0";

a header of each of single codewords "100" and "101" are "10";

a header of a single codeword "11****" ("****" is a value ranging from 000100 to 111111 (values "4" to "63" as decimal numbers)) is "11"; and a header of a single codeword "110000" (EOB) is none.

The decoder 306 decodes a coupled codeword focusing attention on the headers. FIG. 5 shows a table which is obtained by sorting the decode table in FIG. 4 for respective addresses as the outputs from the decoder 306. Also, "shift amount" indicates a shift amount as the output from the table 307, and "base value" indicates the output from the table 307, i.e., an offset value common to each address required to calculate a shift amount. "Number of "1"s" indicates the number of bits "1" other than the headers in each coupled codeword. In FIG. 5, codeword numbers are assigned for the descriptive convenience, but they are different from FIG. 4.

A decode method of an address and shift amount and a calculation method of a pack length will be described below with reference to FIG. 5.

As for codeword numbers "0" to "3", all the headers of single codewords which respectively form coupled codewords are "0". Hence, each of these coupled codewords is decoded as a coupled codeword "0*0*" (* is 0 or 1), and the decoder 306 outputs an address "0". At this time, since the code length of each coupled codeword is "4", a shift amount "4" is output to the shifter 301. The pack length is calculated by adding a base "2" and the number of "1"s. That is, in case of the codeword number "0", since the number of "1"s is 0, the pack length is given by 2+0=2. In case of the codeword numbers "1" and "2", since the number of "1"s is 1, the pack length is given by 2+1=3. Also, in case of the codeword number "3", since the number of "1"s is 2, the pack length is given by 2+2=4. That is, letting code[0:10] (a start bit of coded data is assumed as the 0th bit) be a coupled codeword, the pack length is calculated by a pack length=2+code[1]+code[3], and is output to the packer 304.

Likewise, as for codeword numbers "4" to "7", the headers of single codewords which respectively form coupled codewords are the same. Hence, each of these coupled codewords is decoded as a coupled codeword "0*10*" (* is 0 or 1), and the decoder 306 outputs an address "1". At this time, since the code length of each coupled codeword is "5", a shift amount "5" is output to the shifter 301. The pack length is calculated by a base "4"+"the number of "1"s", i.e., a pack length=4+code[1]+code[4], and is output to the packer 304.

A codeword number "8" corresponds to a case in which the last single codeword of a coupled codeword is an EOB. Hence, this coupled codeword is decoded as a coupled codeword "0*110000" (* is 0 or 1), and the decoder 306 outputs an address "2". At this time, since the code length of the coupled codeword is "8", a shift amount "8" is output to the shifter 301. As the pack length, a value "64" indicating bits until the block end (EOB) is output to the packer 304.

As for codeword numbers "9" and "10", the headers of single codewords which respectively form coupled codewords are the same. Hence, each of these coupled codewords is decoded as a coupled codeword "0*11######" (* is 0 or 1, ###### is a value ranging from 000100 to 111111 (4 to 62 as decimal numbers), and let n be this value), and the decoder 306 outputs an address "3". At this time, since the code length of each coupled codeword is "10", a shift amount "10" is output to the shifter 301. The pack length is calculated by a base "2"+"the number of "1"s"+n, i.e., a pack length=2+code[1]+n, and is output to the packer 304.

As for codeword numbers "11" to "14", the headers of single codewords which respectively form coupled codewords are the same. Hence, each of these coupled codewords is decoded as a coupled codeword "10*0*" (* is 0 or 1), and the decoder 306 outputs an address "4". At this time, since the code length of each coupled codeword is "5", a shift amount "5" is output to the shifter 301. Also, the pack length is calculated by a base "4"+"the number of "1"s", i.e., a pack length=4+code[2]+code[4], and is output to the packer 304.

As for codeword numbers "15" to "18", the headers of single codewords which respectively form coupled codewords are the same. Hence, each of these coupled codewords is decoded as a coupled codeword "10*10*" (* is 0 or 1), and the decoder 306 outputs an address "5". At this time, since the code length of each coupled codeword is "6", a shift amount "6" is output to the shifter 301. Also, the pack length is calculated by a base "6"+"the number of "1"s", i.e., a pack length=6+code[2]+code[5], and is output to the packer 304.

A codeword number "19" corresponds to a case in which the last single codeword of a coupled codeword is an EOB in association with codeword numbers "20" and "21". Hence, this coupled codeword is decoded as a coupled codeword "10*110000" (* is 0 or 1), and the decoder 306 outputs an address "6". At this time, since the code length of the coupled codeword is "9", a shift amount "9" is output to the shifter 301. As the pack length, a value "64" indicating bits until the block end (EOB) is output to the packer 304.

As for the codeword numbers "20" and "21", the headers of single codewords which respectively form coupled codewords are the same. Hence, each of these coupled codewords is decoded as a coupled codeword "10*11######" (* is 0 or 1, ###### is a value ranging from 000100 to 111100 (4 to 60 as decimal numbers), and let n be this value), and the decoder 306 outputs an address "7". At this time, since the code length of each coupled codeword is "11", a shift amount "11" is output to the shifter 301. The pack length is calculated by a base "4"+"the number of "1"s"+n, i.e., a pack length=4+code[2]+n, and is output to the packer 304.

As for a codeword number "22", a single codeword that forms a coupled codeword is an EOB itself. Hence, this coupled codeword is decoded intact, and the decoder 306 outputs an address "8". At this time, since the code length of the coupled codeword is "6", a shift amount "6" is output to the shifter 301. As the pack length, a value "64" is output to the packer 304.

As for a codeword number "23", since a coupled codeword is a single codeword "11****" (**** is a value ranging from 000100 to 111111 (4 to 63 as decimal numbers), and let n be this value) itself, it is decoded intact, and the decoder 306 outputs an address "9". At this time, since the code length of the coupled codeword is "8", a shift amount "8" is output to the shifter 301. The pack length is calculated by a pack length=1+n to have a base "1", and is output to the packer 304.

As described above, in the decoder 306, and the tables 307 and 308, since each coupled codeword is decoded focusing attention on the header configuration, and the pack length is calculated using the number of bits "1" other than the headers in each coupled codeword, 24 entries can be reduced to 10, and the circuit scales of the decoder 306 and the tables 307 and 308 can be reduced.

In this embodiment, upon detection of an EOB, the pack length=64, the shifter 301 skips bits to a fixed length end (i.e., a block end), and the packer 304 operates under the assumption that bit "4" (the last pixel value) of the table 303 continues up to the block end. In this embodiment, the EOB code itself is detected. Alternatively, a single codeword "11******" may be decoded, and a case that meets n<4 may be detected as an EOB.

The operation of the packer 304 will be described below with reference to FIG. 6. The packer 304 includes a control circuit including a buffer for 64 bits per block, and a counter, and outputs coupled symbol data from the table 303 to the output terminal 305 for respective 16-bit units.

Rows (ordinate) of a table shown in FIG. 6 indicate processing cycle numbers, and suffix n appended to respective items in columns (abscissa) indicates an n-th cycle state of each signal. For example, "sdata$_n$" is coupled symbol data input from the table 303 in a cycle n. "end$_n$" is a value of the last bit position of coupled symbol data sdata$_{n-1}$ input in an immediately preceding cycle n−1, which value is decided by:

$$end_n = sdata_{n-1}(4) \tag{3}$$

Note that the first several symbol data of one block are set using an initial value input from the input terminal 310 as the value of the last bit position of coupled symbol data of the immediately preceding cycle. That is, when the initial value is "0", it is determined that coupled symbol data of the immediately preceding cycle ends at "1", and the last bit position is set to be "1". When the initial value is "1", it is determined that coupled symbol data of the immediately preceding cycle ends at "0", and the last bit position is set to be "0".

Also, "$sum_n$" in FIG. 6 indicates a sum of pack lengths input within the processing of one block until the cycle n, and is calculated by:

$$\text{When } sum_{n-1} \leq 64 \text{ and } ocnt_n \neq 4, sum_n = sum_{n-1} + plen_n \quad (4)$$

$$\text{When } sum_{n-1} > 64 \text{ and } ocnt_n \neq 4, sum_n = sum_{n-1} \quad (5)$$

When $sum_n$ is larger than "64", the value is held in the next cycle. When the number of data $ocnt_n$ (to be described later) for respective 16-bit units (to be referred to as the number of output packs hereinafter) which are output until the cycle n is "4", the value is set to be "0":

$$\text{When } ocnt_n = 4, sum_n = \quad (6)$$

"$sptr_n$" in FIG. 6 indicates a start bit position upon storing the coupled symbol data $sdata_n$ in the buffer, and is calculated by:

$$\text{When } sum_n \leq 64 \text{ and } ocnt_n \neq 4, sptr_n = sum_{n-1} \quad (7)$$

However, when $sum_n > 64$, $sptr_n$ is clipped to a value $sptr_{n-1}$ of the immediately preceding cycle n−1:

$$\text{When } sum_n > 64 \text{ and } ocnt_n \neq 4, sptr_n = sptr_{n-1} \quad (7\text{-}1)$$

When the number of output packs $ocnt_n$ (to be described later) is "4", the value is set to be "0":

$$\text{When } ocnt_n = 4, sptr_n = 0 \quad (8)$$

"$eptr_n$" in FIG. 6 indicates an end bit position upon storing the coupled symbol data $sdata_n$ in the buffer, and is calculated by:

$$\text{When } sum_n \leq 64 \text{ and } ocnt_n \neq 4, eptr_n = sum_n 1 \quad (9)$$

However, when $sum_n > 64$, the value is clipped to "63" as a maximum bit position of the buffer:

$$\text{When } sum_n > 64 \text{ and } ocnt_n \neq 4, eptr_n = 63 \quad (10)$$

When the number of output packs $ocnt_n$ (to be described later) is "4", the value is set to be "0":

$$\text{When } ocnt_n = 4, eptr_n = 0 \quad (11)$$

"$ext_n$" in FIG. 6 is a flag which is set to be "1" when a pack length $plen_n$ exceeds a data length (5 bits) of the coupled symbol data $sdata_n$, and is calculated by:

$$\text{When } plen_n \leq 5, ext_n = 0 \quad (12)$$

$$\text{When } plen_n > 5, ext_n = 1 \quad (13)$$

"$extptr_n$" in FIG. 6 indicates a bit extension start position upon storing the coupled symbol data $sdata_n$ in the buffer in the next cycle n+1, since the value $end_n$ of the last bit position has to be extended by the number of bits exceeding $end_n$, when the pack length $plen_n$ exceeds a data length (5 bits) of the coupled symbol data $sdata_n$ (when $ext_n = 1$). Hence, this value is calculated by subtracting the number of exceeding bits from $sum_n$ when $ext_n = 1$, as given by:

$$\text{When } ext_n = 0 \text{ and } ocnt_n \neq 4, extptr_n = sum_n \quad (14)$$

$$\text{When } ext_n = 1 \text{ and } ocnt_n \neq 4, extptr_n = sum_n - (plen_n - 5) \quad (15)$$

Also, when the number of output packs $ocnt_n$ (to be described later) is "4", the value is set to be "0", as given by:

$$\text{When } ocnt_n = 4, extptr_n = 0 \quad (16)$$

"$pcnt_n$" in FIG. 6 indicates how many packs the accumulated total of pack lengths input within the processing of one block corresponds to (to be referred to as the number of input packs hereinafter), and is calculated by:

$$\text{When } sum_n \leq 64 \text{ and } ocnt_n \neq 4, pcnt_n = sum_n/16 \quad (17)$$

Note that the division in equation (17) is calculated by truncating bits after the decimal point. When $sum_n > 64$, the value is clipped to "4", as given by:

$$\text{When } sum_n > 64 \text{ and } ocnt_n \neq 4, pcnt_n = 4 \quad (18)$$

When the number of output packs $ocnt_n$ (to be described later) is "4", the value is set to be "0", as given by:

$$\text{When } ocnt_n = 4, pcnt_n = 0 \quad (19)$$

"$busy_n$" in FIG. 6 is a signal which is not shown in FIG. 3, and is a stop signal used to control to stop inputting of coupled symbol data and pack lengths to the table 303 and calculator 309 when it is determined in the cycle n−1 that the buffer is filled in the next cycle n. When a sum $sum_{n-1}$ of pack lengths is equal to or larger than 64, since the buffer is filled in the cycle n, a value "1" is output to the table 303 and calculator 309 until outputting of pack data for one block is completed. Hence, this value is calculated by:

$$\text{When } sum_{n-1} \leq 64, busy_{n-1} = 0 \quad (20)$$

$$\text{When } sum_{n-1} > 64, busy_{n-1} = 1 \quad (21)$$

Also, the table 303 and calculator 309 hold the values of the cycle n−1 as the coupled symbol data $sdata_n$ and pack length $plen_n$ when the value of busy in the cycle n−1 is "1", and can change these values when busy is "0", as given by:

$$\text{When } busy_{n-1} = 1, sdata_n = sdata_{n-1} \quad (22)$$

$$\text{When } busy_{n-1} = 0, sdata_n \text{ is changeable} \quad (23)$$

$$\text{When } busy_{n-1} = 1, plen_n = plen_{n-1} \quad (24)$$

$$\text{When } busy_{n-1} = 0, plen_n \text{ is changeable} \quad (25)$$

"$rest_n$" in FIG. 6 indicates the number of packs of data which are not output with respect to the number of input packs in the cycle n (to be referred to as the number of non-output packs hereinafter), and is expressed as a difference between the number of input packs $pcnt_n$ and the number of output packs $ocnt_n$ (to be described later), as given by:

$$\text{When } ocnt_n \neq 4, rest_n = pcnt_n - ocnt_n \quad (26)$$

However, when the number of output packs $ocnt_n$ (to be described later) is "4", the value is set to be "0", as given by:

$$\text{When } ocnt_n = 4, rest_n = 0 \quad (27)$$

"$valid_n$" in FIG. 6 indicates a signal which is not shown in FIG. 3, and is a valid signal (a value of which will be described below) indicating whether or not the output from the packer 304 is valid data with respect to the output terminal 305. When $valid_n = $"1", it indicates that the output is valid; when $valid_n = $"0", it indicates that the output is invalid. If the number of non-output packs "$rest_{n-1}$" is larger than "0" in the immediately preceding cycle n−1, since the packed data can be output, the value of the valid signal $valid_n$ is set to be "1", as given by:

$$\text{When } rest_{n-1} > 0, valid_n = 1 \quad (28)$$

If the value of "$rest_{n-1}$" is "0", the value of the valid signal $valid_n$ is set to be "0", as given by:

$$\text{When } rest_{n-1} = 0, valid_n = 0 \quad (29)$$

"$ocnt_n$" in FIG. 6 indicates the number of output packs in the cycle n. As in the valid signal $valid_n$, this value is incremented by "1" when the number of non-output packs "$rest_{n-1}$" in the previous cycle n−1 is larger than "0", and the value is held when the value of "$rest_{n-1}$" is "0". The operation of "$ocnt_n$" is described by:

When $rest_{n-1} > 0$ and $ocnt_{n-1} \neq 4$, $ocnt_n = ocnt_{n-1} + 1$ (30)

When $rest_{n-1} = 0$ and $ocnt_{n-1} \neq 4$, $ocnt_n = ocnt_{n-1}$ (31)

However, when the number of output packs $ocnt_{n-1}$ in the previous cycle is "4", the value is cleared to "0", as given by:

When $ocnt_{n-1} = 4$, $ocnt_n = 0$ (32)

"$buf_n$" in FIG. 6 indicates the value of the buffer for 64 bits of one block in the cycle n−1, and FIG. 6 shows this value separately for respective 16-bit units as units to be packed. The 0th to 15th bits of "$buf_n$" are expressed as "$buf_n(0:15)$". "$buf_n(16:31)$" indicates the 16th to 31st bits of "$buf_n$", and "$buf_n(32:47)$" indicates the 32nd to 47th bits of "$buf_n$". "$buf_n(48:63)$" indicates the 48th to 63rd bits of "$buf_n$". When the coupled symbol data $sdata_{n-1}$ is stored in the buffer $buf_n$, the value to be stored in the buffer $buf_n$ is bit-inverted and stored depending on the value $end_{n-1}$ of the last bit position.

Also, when the flag $ext_{n-1}$ is "0" in the cycle n−1, the value $end_{n-1}$ of the last bit position is not bit-extended, and coupled symbol data $sdata_{n-1}(0:plen_{n-1}-1)$ having a data width $plen_{n-1}$ is stored in the buffer $buf_n$ in the next cycle n. At this time, since the coupled symbol data $sdata_{n-1}$ is stored in an area from the start bit position $sptr_{n-1}$ to the end bit position $eptr_{n-1}$, when the value $end_{n-1}$ of the last bit position is "0", the value $buf_n$ is expressed by:

When $end_{n-1} = 0$ and $ext_{n-1} = 0$, $buf_n(sptr_{n-1}:eptr_{n-1}) = sdata_{n-1}(0:plen_{n-1}-1)$ (33)

On the other hand, when the value $end_{n-1}$ is "1", the value $buf_n$ is expressed by:

When $end_{n-1} = 1$ and $ext_{n-1} = 0$, $buf_n(sptr_{n-1}:eptr_{n-1}) = not(sdata_{n-1}(0:plen_{n-1}-1))$ (34)

where "not( )" indicates bit inversion of respective bits.

On the other hand, when the flag $ext_{n-1}$ is "1" in the cycle n−1, since the data width $plen_{n-1}$ is larger than "5", coupled symbol data $sdata_{n-1}(0:4)$ is stored in the buffer $buf_n$ in the next cycle n. At this time, the coupled symbol data $sdata_{n-1}$ is stored in an area from the start bit position $sptr_{n-1}$ to a position 1 bit before the end bit position $eptr_{n-1}$. Hence, when the value $end_{n-1}$ of the last bit position is "0", the value $buf_n$ is expressed by:

When $end_{n-1} = 0$ and $ext_{n-1} = 1$, $buf_n(sptr_{n-1}:extptr_{n-1}-1) = sdata_{n-1}(0:4)$ (35)

On the other hand, when the value $end_{n-1}$ is "1", the value $buf_n$ is expressed by:

When $end_{n-1} = 1$ and $ext_{n-1} = 1$, $buf_n(sptr_{n-1}:extptr_{n-1}-1) = not(sdata_{n-1}(0:4))$ (36)

At the same time, when the flag $ext_{n-1}$ is "1", the value of coupled symbol data $sdata_{n-1}(4)$ is extended to a range from the bit extension start position $extptr_{n-1}$ to the end bit position $eptr_{n-1}$, and is stored in the buffer $buf_n$ in the next cycle n. Hence, when the value $end_{n-1}$ of the last bit position is "0", the value $buf_n$ is expressed by:

When $end_{n-1} = 0$ and $ext_{n-1} = 1$:

$buf_n(extptr_{n-1}:eptr_{n-1}) = sdata_{n-1}(4), sdata_{n-1}(4), \ldots, sdata_{n-1}(4)$ (37)

On the other hand, when the value $end_{n-1}$ is "1", the value $buf_n$ is expressed by:

When $end_{n-1} = 1$ and $ext_{n-1} = 1$:

$buf_n(extptr_{n-1}:eptr_{n-1}) = not(sdata_{n-1}(4), sdata_{n-1}(4), \ldots, sdata_{n-1}(4))$ (38)

"output" in FIG. 6 indicates that of packed data of the packer 304, each of 16-bit buffer areas "$buf_n(0:15)$", "$buf_n(16:31)$", "$buf_n(32:47)$", and "$buf_n(48:63)$" is selected according to the value of the number of output packs $ocnt_n$ in each cycle. The selection operations are respectively described as:

When $ocnt_n = 1$, $output = buf_n(0:15)$ (39)

When $ocnt_n = 2$, $output = buf_n(16:31)$ (40)

When $ocnt_n = 3$, $output = buf_n(32:47)$ (41)

When $ocnt_n = 4$, $output = buf_n(48:63)$ (42)

The operations executed when coupled symbol data for 64 bits of one block are input to the packer 304 in the order of pack lengths=2, 5, 7, 17, 19, and EOB (64), and the initial value "1" is set at the input terminal 310 will be exemplified below.

In cycle 0, initialization means such as a reset operation sets "0" in a $sum_0$ of pack lengths, start bit position $sptr_0$, end bit position $eptr_0$, flag $ext_0$, bit extension start position $extptr_0$, the number of input packs $pcnt_0$, the number of non-output packs $rest_0$, and the number of output packs $ocnt_0$. Since the first pixel value of a block input from the input terminal 310 is "1", it is determined that the last bit (i.e., the immediately preceding pixel value) of coupled symbol data of the previous cycle is "0", and "0" is set in a value $end_0$ of the last bit position. At this time, both a valid signal $valid_0$ and stop signal $busy_0$ are initialized and output as "0".

In next cycle 1, n=1, and since $busy_0 = 0$, the condition of equation (23) is met, and a value "10000" of the codeword number "0" in FIG. 5 is input as coupled symbol data $sdata_1$. Likewise, since $busy_0 = 0$, the condition of equation (25) is met, and "2" is input as a pack length $plen_1$.

A value $end_1$ of the last bit position normally stores the 4th bit of coupled symbol data input in cycle 0. However, since no coupled symbol data is input in cycle 0, the value $end_1$ holds the value "0" of $end_0$.

Likewise, since no coupled symbol data is input in cycle 0, since equations (33) to (38) do not hold, no data is stored in a buffer $buf_1$.

The number of output packs $ocnt_1$ is set to be "0" ($ocnt_1 = ocnt_0 = 0$), since $rest_0 = 0$ and $ocnt_0 = 0$, and the condition of equation (31) is met.

A sum $sum_1$ of pack lengths is set to be "2" ($sum_1 = sum_0 + plen_1 = 0 + 2 = 2$), since $sum_0 = 0$ and $ocnt_1 = 0$, and the condition of equation (4) is met.

A start bit position $sptr_1$ is set to be "0" ($sptr_1 = sum_0 = 0$), since $sum_1 = 2$ and $ocnt_1 = 0$, and the condition of equation (7) is met.

An end bit position $eptr_1$ is set to be "1" ($eptr_1 = sum_1 1 = 2-1 = 1$), since $sum_1 = 2$ and $ocnt_1 = 0$, and the condition of equation (9) is met.

A flag $ext_1$ is set to be "0", since the pack length $plen_1 = 2$, and the condition of equation (12) is met.

A bit extension start position $extptr_1$ is set to be "2" ($extptr_1 = sum_1 = 2$), since $ext_1 = 0$ and $ocnt_1 = 0$, and the condition of equation (14) is met.

The number of input packs $pcnt_1$ is set to be "0" ($pcnt_1 = sum_1/16 = 2/16 = 0$), since $sum_1 = 2$ and $ocnt_1 = 0$, and the condition of equation (17) is met.

The number of non-output packs $rest_1$ is set to be "0" ($rest_1 = pcnt_1 - ocnt_1 = 0 - 0 = 0$), since $ocnt_1 = 0$ and the condition of equation (26) is met.

As $valid_1$, "0" is output since $rest_0 = 0$, and the condition of equation (29) is met.

Furthermore, a stop signal $busy_1$="0" is output, since $sum_1=2$, and the condition of equation (20) is met.

In next cycle 2, n=2, and since $busy_1=0$, the condition of equation (23) is met, and a value "10000" of the codeword number "5" in FIG. 5 is input as coupled symbol data $sdata_2$. Likewise, since $busy_2=0$, the condition of equation (25) is met, and "5" is input as a pack length $plen_2$.

As a value $end_2$ of the last bit position, a value "0" of coupled symbol data $sdata_1(4)$ is input according to equation (3).

Furthermore, for a buffer $buf_2$, the condition of equation (33) is met since $end_1=0$ and $ext_1=0$. In equation (33), from $sptr_1=0$, $eptr_1=1$, and $plen_1=2$, the left-hand side of equation (33) is $buf_2(sptr_1:eptr_1)=buf_2(0:1)$, and the right-hand side is $sdata_1(0:plen_1-1)=sdata_1(0:2-1)=sdata_1(0:1)=$"10". Therefore, $buf_2(0:1)=$"10", and "10" is stored in the 0th and 1st bits of the buffer buf.

The number of output packs $ocnt_2$ is set to be "0" ($ocnt_2=ocnt_1=0$), since $rest_1=0$ and $ocnt_1=0$, and the condition of equation (31) is met.

A sum $sum_2$ of pack lengths is set to be "7" ($sum_2=sum_1+plen_2=2+5=7$), since $sum_1=2$ and $ocnt_2=0$, and the condition of equation (4) is met.

A start bit position $sptr_2$ is set to be "2" ($sptr_2=sum_1=2$), since $sum_2=7$ and $ocnt_2=0$, and the condition of equation (7) is met.

An end bit position $eptr_2$ is set to be "6" ($eptr_2=sum_2-1=7-1=6$), since $sum_2=7$ and $ocnt_2=0$, and the condition of equation (9) is met.

A flag $ext_2$ is set to be "0", since the pack length $plen_2=5$, and the condition of equation (12) is met.

A bit extension start position $extptr_2$ is set to be "7" ($extptr_2=sum_2=7$), since $ext_2=0$ and $ocnt_2=0$, and the condition of equation (14) is met.

The number of input packs $pcnt_2$ is set to be "0" ($pcnt_2=sum_2/16=7/16=0$), since $sum_2=7$ and $ocnt_2=0$, and the condition of equation (17) is met.

The number of non-output packs $rest_2$ is set to be "0" ($rest_2=pcnt_2-ocnt_2=0-0=0$), since $ocnt_2=0$, and the condition of equation (26) is met.

A valid signal $valid_2$="0" is output, since $rest_1=0$, and the condition of equation (29) is met.

Furthermore, a stop signal $busy_2$="0" is output, since $sum_2=7$, and the condition of equation (20) is met.

In next cycle 3, n=3, and since $busy_2=0$, the condition of equation (23) is met, and a value "11100" of the codeword number "16" in FIG. 5 is input as coupled symbol data $sdata_3$. Likewise, since $busy_2=0$, the condition of equation (25) is met, and "7" is input as a pack length $plen_3$.

As a value $end_3$ of the last bit position, a value "0" of coupled symbol data $sdata_2(4)$ is input according to equation (3).

Furthermore, for a buffer $buf_3$, the condition of equation (33) is met since $end_2=0$ and $ext_2=0$. In equation (33), from $sptr_2=2$, $eptr_2=6$, and $plen_2=5$, the left-hand side of equation (33) is $buf_3(sptr_2:eptr_2)=buf_3(2:6)$. Then, the right-hand side is $sdata_2(0:plen_2-1)=sdata_2(0:5-1)=sdata_2(0:4)=$"10000". Therefore, $buf_3(2:6)=$"10000", and "10000" is stored in the 2nd to 6th bits of the buffer buf. Hence, by combining with data stored in cycle 2, $buf_3(0:6)=$"1010000".

The number of output packs $ocnt_3$ is set to be "0" ($ocnt_3=ocnt_2=0$), since $rest_2=0$ and $ocnt_2=0$, and the condition of equation (31) is met.

A sum $sum_3$ of pack lengths is set to be "14" ($sum_3=sum_2+plen_3=7+7=14$), since $sum_2=7$ and $ocnt_3=0$, and the condition of equation (4) is met.

A start bit position $sptr_3$ is set to be "7" ($sptr_3=sum_2=7$), since $sum_3=14$ and $ocnt_2=0$, and the condition of equation (7) is met.

An end bit position $eptr_3$ is set to be "13" ($eptr_3=sum_3-1=14-1=13$), since $sum_3=14$ and $ocnt_3=0$, and the condition of equation (9) is met.

A flag $ext_3$ is set to be "1", since the pack length $plen_3=7$, and the condition of equation (13) is met.

A bit extension start position $extptr_3$ is set to be "12" ($extptr_3=sum_3-(plen_3-5)=14-(7-5)=12$), since $ext_3=1$ and $ocnt_3=0$, and the condition of equation (15) is met.

The number of input packs $pcnt_3$ is set to be "0" ($pcnt_3=sum_3/16=14/16=0$), since $sum_3=14$ and $ocnt_3=0$, and the condition of equation (17) is met.

The number of non-output packs $rest_3$ is set to be "0" ($rest_3=pcnt_3-ocnt_3=0-0=0$), since $ocnt_3=0$, and the condition of equation (26) is met.

A valid signal $valid_3$="0" is output, since $rest_2=0$, and the condition of equation (29) is met.

Furthermore, a stop signal $busy_3$="0" is output, since $sum_3=14$, and the condition of equation (20) is met.

In next cycle 4, n=4, and since $busy_3=0$, the condition of equation (23) is met, and a value "11000" of the codeword number "10" in FIG. 5 is input as coupled symbol data $sdata_4$. Likewise, since $busy_3=0$, the condition of equation (25) is met, and "17" is input as a pack length $plen_4$.

As a value $end_0$ of the last bit position, a value "0" of coupled symbol data $sdata_3(4)$ is input according to equation (3).

Furthermore, for a buffer $buf_4$, the condition of equation (35) is met since $end_3=0$ and $ext_3=1$. In equation (35), from $sptr_3=7$ and $extptr_3=12$, since the left-hand side of equation (35) is $buf_4(sptr_3:extptr_3-1)=buf_4(7:12-1)=buf_4(7:11)$, and the right-hand side is $sdata_3(0:4)=$"11100", $buf_4(7:11)=$"11100". Therefore, "11100" is stored in the 7th to 11th bits of the buffer buf. Also, the condition of equation (37) is met. In equation (37), from $extptr_3=12$ and $eptr_3=13$, since the left-hand side of equation (37) is $buf_4(extptr_3:eptr_3)=buf_4(12:13)$, and the right-hand side is "00" by extending $sdata_3(4)$ by 2 bits, $buf_4(12:13)=$"00". Therefore, "00" is stored in the 12th and 13th bits of the buffer buf. Hence, by combining with data stored in cycles 2 and 3, $buf_4(0:13)=$"10100001110000".

The number of output packs $ocnt_4$ is set to be "0" ($ocnt_4=ocnt_3=0$), since $rest_3=0$ and $ocnt_3=0$, and the condition of equation (31) is met.

A sum $sum_4$ of pack lengths is set to be "31" ($sum_4=sum_3+plen_4=14+17=31$), since $sum_3=14$ and $ocnt_4=0$, and the condition of equation (4) is met.

A start bit position $sptr_4$ is set to be "14" ($sptr_4=sum_3=14$), since $sum_4=31$ and $ocnt_4=0$, and the condition of equation (7) is met.

An end bit position $eptr_4$ is set to be "30" ($eptr_4=sum_4-1=31-1=30$), since $sum_4=31$ and $ocnt_4=0$, and the condition of equation (9) is met.

A flag $ext_4$ is set to be "1", since the pack length $plen_4=17$, and the condition of equation (13) is met.

A bit extension start position $extptr_4$ is set to be "19" ($extptr_4=sum_4-(plen_4-5)=31-(17-5)=19$), since $ext_4=1$ and $ocnt_4=0$, and the condition of equation (15) is met.

The number of input packs $pcnt_4$ is set to be "1" ($pcnt_4=sum_4/16=31/16=1$), since $sum_4=31$ and $ocnt_4=0$, and the condition of equation (17) is met.

The number of non-output packs $rest_4$ is set to be "1" ($rest_4=pcnt_4-ocnt_4=1-0=1$), since $ocnt_4=0$ and the condition of equation (26) is met.

A valid signal $valid_4$="0" is output, since $rest_3=0$, and the condition of equation (29) is met.

Furthermore, a stop signal $busy_4$="0" is output, since $sum_4$=31, and the condition of equation (20) is met.

In next cycle 5, n=5, and since $busy_4$=0, the condition of equation (23) is met, and a value "11100" of the codeword number "20" in FIG. 5 is input as coupled symbol data $sdata_5$. Likewise, since $busy_4$=0, the condition of equation (25) is met, and "19" is input as a pack length $plen_5$.

As a value $end_5$ of the last bit position, a value "0" of coupled symbol data $sdata_4$(4) is input according to equation (3).

Furthermore, for a buffer $buf_5$, the condition of equation (35) is met since $end_0$=0 and $ext_4$=1. In equation (35), from $sptr_4$=14 and $extptr_4$=19, since the left-hand side of equation (35) is $buf_5(sptr_4:extptr_4-1)=buf_5(14:19-1)=buf_5(14:18)$, and the right-hand side is $sdata_4(0:4)$="11000", $buf_5(14:18)$="11000". Therefore, "11000" is stored in the 14th to 18th bits of the buffer buf. Also, the condition of equation (37) is met. In equation (37), from $extptr_4$=19 and $eptr_4$=30, since the left-hand side of equation (37) is $buf_5(extptr_4:eptr_4)=buf_5(19:30)$, and the right-hand side is "000000000000" by extending $sdata_4$(4) by 12 bits, $buf_5(19:30)$="000000000000". Therefore, "000000000000" is stored in the 19th to 30th bits of the buffer buf. Hence, by combining with data stored in cycles 2, 3, and 4, $buf_5(0:15)$="1010000111000011" and $buf_5(16:30)$="000000000000000".

The number of output packs $ocnt_5$ is set to be "1" ($ocnt_5=ocnt_4+1=0+1=1$), since $rest_4$=1 and $ocnt_4$=0, and the condition of equation (30) is met.

A sum $sum_5$ of pack lengths is set to be "50" ($sum_5=sum_4+plen_5=31+19=50$), since $sum_4$=31 and $ocnt_5$=1, and the condition of equation (4) is met.

A start bit position $sptr_5$ is set to be "31" ($sptr_5=sum_4=31$), since $sum_5$=50 and $ocnt_5$=1, and the condition of equation (7) is met.

An end bit position $eptr_5$ is set to be "49" ($eptr_5=sum_5-1=50-1=49$), since $sum_5$=50 and $ocnt_5$=1, and the condition of equation (9) is met.

A flag $ext_5$ is set to be "1", since the pack length $plen_1$=19, and the condition of equation (13) is met.

A bit extension start position $extptr_1$ is set to be "36" ($extptr_5=sum_5-(plen_1-5)=50-(19-5)=36$), since $ext_5$=1 and $ocnt_5$=1, and the condition of equation (15) is met.

The number of input packs $pcnt_5$ is set to be "3" ($pcnt_5=sum_5/16=50/16=3$), since $sum_5$=50 and $ocnt_5$=1, and the condition of equation (17) is met.

The number of non-output packs $rest_5$ is set to be "2" ($rest_5=pcnt_5-ocnt_5=3-1=2$), since $ocnt_5$=1, and the condition of equation (26) is met.

A valid signal $valid_1$="1" is output, since $rest_4$=1, and the condition of equation (28) is met. At this time, since the number of output packs $ocnt_5$ is "1", equation (39) is met, and the value "1010000111000011" of the buffer $buf_1(0:15)$ is selected and output as packed output data.

Furthermore, a stop signal $busy_5$="0" is output, since $sum_5$=50, and the condition of equation (20) is met.

In next cycle 6, n=6, and since $busy_5$=0, the condition of equation (23) is met, and assume that an EOB (64) is input as a last single codeword in coupled symbol data of the codeword number "9" in FIG. 5 as coupled symbol data $sdata_6$. That is, "10000" is input. Likewise, since $busy_5$=0, the condition of equation (25) is met, and "EOB", i.e., "64", is input as a pack length $plen_6$.

As a value $end_6$ of the last bit position, a value "0" of coupled symbol data $sdata_5$(4) is input according to equation (3).

Furthermore, for a buffer $buf_6$, the condition of equation (35) is met since $end_5$=0 and $ext_5$=1. In equation (35), from $sptr_5$=31 and $extptr_5$=36, since the left-hand side of equation (35) is $buf_6(sptr_5:extptr_5-1)=buf_6(31:36-1)=buf_6(31:35)$, and the right-hand side is $sdata_5(0:4)$="11100", $buf_6(31:35)$="11100". Therefore, "11100" is stored in the 31st to 35th bits of the buffer buf. Also, the condition of equation (37) is met. In equation (37), from $extptr_5$=36 and $eptr_5$=49, the left-hand side of equation (37) is $buf_6(extptr_5:eptr_5)=buf_6(36:49)$. Also, since the right-hand side is "00000000000000" by extending $sdata_5$(4) by 14 bits, $buf_6(36:49)$="00000000000000". Therefore, "00000000000000" is stored in the 36th to 49th bits of the buffer buf. Hence, by combining with data stored in cycles 2, 3, 4, and 5, $buf_6(0:15)$="1010000111000011", $buf_6(16:31)$="0000000000000001", and $buf_6(32:47)$="1110000000000001", and $buf_6(48:49)$="00".

The number of output packs $ocnt_6$ is set to be "2" ($ocnt_6=ocnt_5+1=1+1=2$), since $rest_5$=2 and $ocnt_5$=1, and the condition of equation (30) is met.

A sum $sum_6$ of pack lengths is set to be "114" ($sum_6=sum_5+plen_6=50+64=114$), since $sum_5$=50 and $ocnt_6$=2, and the condition of equation (4) is met.

A start bit position $sptr_6$ is set to be "50" ($sptr_6=sum_5=50$), since $sum_6$=114 and $ocnt_6$=2, and the condition of equation (7) is met.

An end bit position $eptr_6$ is set to be "63", since $sum_6$=114 and $ocnt_6$=2, and the condition of equation (10) is met.

A flag $ext_6$ is set to be "1", since the pack length $plen_6$=64, and the condition of equation (13) is met.

A bit extension start position $extptr_6$ is set to be "55" ($extptr_6=sum_6-(plen_6-5)=114-(64-5)=55$), since $ext_6$=1 and $ocnt_6$=2, and the condition of equation (15) is met.

The number of input packs $pcnt_6$ is set to be "4", since $sum_6$=114 and $ocnt_6$=2, and the condition of equation (18) is met.

The number of non-output packs $rest_6$ is set to be "2" ($rest_6=pcnt_6-ocnt_6=4-2=2$), since $ocnt_6$=2, and the condition of equation (26) is met.

A valid signal $valid_6$="1" is output, since $rest_5$=2, and the condition of equation (28) is met. At this time, since the number of output packs $ocnt_6$ is "2", equation (40) is met, and the value "0000000000000001" of the buffer $buf_6(16:31)$ is selected and output as packed output data.

Furthermore, a stop signal $busy_6$="1" is output, since $sum_6$=114, and the condition of equation (21) is met.

In next cycle 7, n=7, and since $busy_6$=1, the condition of equation (22) is met, and inputting of coupled symbol data to the table 303 is stopped (data in cycle 6 is held). Likewise, since $busy_6$=1, the condition of equation (24) is met, and inputting of a pack length to the calculator 309 is stopped (data in cycle 6 is held).

As a value $end_7$ of the last bit position, a value "0" of coupled symbol data $sdata_6$(4) is input according to equation (3).

Furthermore, for a buffer $buf_7$, the condition of equation (35) is met since $end_6$=0 and $ext_6$=1. In equation (35), from $sptr_6$=50 and $extptr_6$=55, since the left-hand side of equation (35) is $buf_7(sptr_6:extptr_6-1)=buf_7(50:55-1)=buf_7(50:54)$, and the right-hand side is $sdata_6(0:4)$="10000", $buf_7(50:54)$="10000". Therefore, "10000" is stored in the 50th to 54th bits of the buffer buf. Also, the condition of equation (37) is met. In equation (37), from $extptr_6$=55 and $eptr_6$=63, the left-hand side of equation (37) is $buf_7(extptr_6:eptr_6)=buf_7(55:63)$. Also, since the right-hand side is "000000000" by extending $sdata_6$(4) by 9 bits, $buf_7(55:63)$="000000000". Therefore, "000000000" is stored in the 55th to 63rd bits of the buffer buf. Hence, by combining with data stored in cycles 2, 3, 4, 5, and 6, $buf_7(0:15)$="1010000111000011", $buf_7(16:31)$="0000000000000001", and $buf_7(32:47)$="1110000000000001", and $buf_7(48:63)$="0010000000000000".

The number of output packs $ocnt_7$ is set to be "3" ($ocnt_7=ocnt_6+1=230 1=3$), since $rest_6=2$ and $ocnt_6=2$, and the condition of equation (30) is met.

A sum $sum_7$ of pack lengths is set to be "114" ($sum_7=sum_6=114$), since $sum_6=114$ and $ocnt_7=3$, and the condition of equation (5) is met.

A start bit position $sptr_7$ is set to be "50" ($sptr_7=sptr_6=50$), since $sum_7=114$ and $ocnt_7=3$, and the condition of equation (7-1) is met.

An end bit position $eptr_7$ is set to be "63", since $sum_7=114$ and $ocnt_7=3$, and the condition of equation (10) is met.

A flag $ext_7$ is set to be "1", since the pack length $plen_7=64$, and the condition of equation (13) is met.

A bit extension start position $extptr_7$ is set to be "55" ($extptr_7=sum_7-(plen_7-5)=114-(64-5)=55$), since $ext_7=1$ and $ocnt_7=3$, and the condition of equation (15) is met.

The number of input packs $pcnt_7$ is set to be "4", since $sum_7=114$ and $ocnt_7=3$, and the condition of equation (18) is met.

The number of non-output packs $rest_7$ is set to be "1" ($rest_7=pcnt_7-ocnt_7=4-3=1$), since $ocnt_7=3$, and the condition of equation (26) is met.

A valid signal $valid_7$="1" is output, since $rest_7=1$, and the condition of equation (28) is met. At this time, since the number of output packs $ocnt_7$ is "3", equation (41) is met, and the value "1110000000000001" of the buffer $buf_7(32:47)$ is selected and output as packed output data.

Furthermore, a stop signal $busy_7$="1" is output, since $sum_7=114$, and the condition of equation (21) is met.

In next cycle 8, n=8, and since $busy_7=1$, the condition of equation (22) is met, and inputting of coupled symbol data to the table 303 is stopped (data in cycle 7 is held), as in cycle 7. Likewise, since $busy_7=1$, the condition of equation (24) is met, and inputting of a pack length to the calculator 309 is stopped (data in cycle 7 is held).

As a value $end_8$ of the last bit position, a value "0" of coupled symbol data $sdata_7(4)$ is input according to equation (3), as in cycle 7.

Furthermore, in a buffer $buf_8$, since the values $end_7$, $ext_7$, $sptr_7$, $extptr_7$, $eptr_7$, and the like remain unchanged from those in cycle 6, the data of the buffer $buf_8$ are equal to those of the buffer $buf_7$.

The number of output packs $ocnt_8$ is set to be "4" ($ocnt_8=ocnt_7+1=3+1=4$), since $rest_7=1$ and $ocnt_7=3$, and the condition of equation (30) is met.

A sum $sum_8$ of pack lengths is set to be "0", since $ocnt_8=4$, and the condition of equation (6) is met.

A start bit position $sptr_8$ is also set to be "0", since $ocnt_8=4$, and the condition of equation (8) is met.

Likewise, an end bit position $eptr_8$ is set to be "0", since $ocnt_8=4$, and the condition of equation (11) is met.

A flag $ext_8$ is set to be "1", since the pack length $plen_8=64$, and the condition of equation (13) is met.

A bit extension start position $extptr_8$ is also set to be "0", since $ocnt_8=4$, and the condition of equation (16) is met.

The number of input packs $pcnt_8$ is also set to be "0", since $ocnt_8=4$, and the condition of equation (19) is met.

The number of non-output packs $rest_8$ is also set to be "0", since $ocnt_8=4$, and the condition of equation (27) is met.

A valid signal $valid_8$="1" is output, since $rest_7=1$, and the condition of equation (28) is met. At this time, since the number of output packs $ocnt_8$ is "4", equation (42) is met, and the value "0010000000000000" of the buffer $buf_8(48:63)$ is selected and output as packed output data.

Furthermore, a stop signal $busy_8$="0" is output, since $sum_8=0$, and the condition of equation (20) is met.

With the aforementioned operations in cycles 1 to 8, the packing operation of 64 bits of one block is complete. In the next cycle, the number of output packs $ocnt_9$ is cleared to "0", since $ocnt_8=4$ and the condition of equation (32) is met, thus entering an initial state as in cycle 0.

Second Embodiment

A decode table of the second embodiment will be described below with reference to FIGS. 7A and 7B. Note that codeword numbers are assigned to respective coupled codewords for the descriptive convenience as in FIG. 2.

A coupled codeword of a codeword number "0" corresponds to a case in which three single codewords "00" are to be successively decoded, and decoded coupled symbol data is "101" (three pixels are decoded). A coupled codeword of a codeword number "1" corresponds to a case in which two single codewords "00" and a single codeword "01" are to be successively decoded, and decoded coupled symbol data is "1011". A coupled codeword of a codeword number "2" corresponds to a case in which two single codewords "00", and a single codeword "100" are to be successively decoded, and decoded coupled symbol data is "10111". A coupled codeword of a codeword number "3" corresponds to a case in which two single codewords "00", and a single codeword "101" are to be successively decoded, and decoded coupled symbol data is "101111". Furthermore, a coupled codeword of a codeword number "4" corresponds to a case in which two single codewords "00", and a single codeword "11****" (**** is an arbitrary value ranging from 000100 to 111101 (4 to 61 as decimal numbers)) are to be successively decoded, and decoded coupled symbol data includes five to 62"1"s after "10".

With the same method, FIGS. 7A and 7B enumerate combinations when single codewords "00", "01", "100", "101", and "11****" respectively appear as four successive single codewords which form coupled symbol data. However, at codeword numbers "20", "41", "62", and "83", each coupled codeword is formed of two single codewords including "11**" as the second single codeword. Also, at a codeword number "84", a coupled codeword includes only a single codeword "11****".

As exceptional processing (not shown), when a single codeword "EOB" appears in the middle of a coupled codeword, coupled symbol data is output to have "1" for all the remaining pixels in one block when the decode value of an immediately preceding symbol is "0". Also, coupled symbol data is output to have "0" for all the remaining pixels in one block when the decode value of an immediately preceding symbol is "1". Furthermore, when the single codeword "EOB" appears as a start codeword of a coupled codeword (when a coupled codeword itself is an EOB), all "1"s are output as the remaining pixels in one block when the immediately preceding pixel data is "0". Also, all "0"s are output as the remaining pixels in one block when the immediately preceding pixel data is "1".

FIG. 8 is a block diagram showing the arrangement of a decoder 104 according to the second embodiment. Referring to FIG. 8, reference numeral 800 denotes an input terminal of coded data; 801, a shifter which detects a start coupled codeword from coded data; and 802, a decoder which decodes a coupled codeword and outputs an address to a decode table 803 (to be described below). Reference numeral 803 denotes a table which implements the decode table shown in FIGS. 7A and 7B; and 804, a packer which packs decoded coupled symbol data for respective 16-bit units. Reference numeral 805 denotes an output terminal which outputs 16-bit packed pixel data. Reference numeral 806 denotes a decoder which decodes a coupled codeword and supplies an address to tables 807 and 808 (to be described below). Reference numeral 807 denotes a table which outputs an offset value (to be referred to as a base value hereinafter) required to calculate a data length indicating the number of decoded pixels (to be referred to as a pack length hereinafter). Reference numeral 808 denotes a table which outputs a shift amount required to detect a start codeword of coded data. Reference numeral 809 denotes a calculator which calculates a pack length based on the base value from the table 807 and a plurality of coded data; and 810, a 1-bit input terminal which inputs a first pixel value (initial value) of a block.

The processing contents of the decoder 104 in FIG. 8 will be described below. Coded data input from the input terminal 800 is supplied to the decoders 802 and 806 via the shifter 801. In the example of FIGS. 7A and 7B, since the maximum number of bits of a coupled codeword is 14 bits, coded data for 14 bits is supplied to the decoders 802 and 806, and the table 807. The decoder 802 decodes a coupled codeword in FIGS. 7A and 7B, and outputs the decode result as a table address to the table 803.

Note that the table 803 requires 85 coupled codewords shown in FIGS. 7A and 7B. However, in the second embodiment, the number of table entries is reduced to 21, and the circuit scales of the decoder 802 and table 803 are reduced, as will be described later.

After that, the table 803 outputs coupled symbol data to the packer 804 according to the address from the decoder 802. Note that coupled symbol data to be output from the table 803 is stored until the next pixel of the last change point since the position of the last change point and the next pixel value need only be detected in the same manner as that described using FIG. 3. That is, since each of coupled symbol data corresponding to codeword numbers "78" to "82" in FIGS. 7A and 7B has a maximum bit width, each coupled symbol data is output to the packer 804 to have a 9-bit bus width as the next pixel of the last change point at that time.

On the other hand, the decoder 806 decodes a coupled codeword in FIGS. 7A and 7B from the input coded data, and outputs the decode result as a table address to the tables 807 and 808. Note that the table 807 requires the number of entries as many as the number of coupled codewords shown in FIGS. 7A and 7B. However, in the second embodiment, the number of entries is reduced to 22, thus reducing the circuit scales of the decoder 806, and tables 807 and 808, as will be described later.

As will be described later with reference to FIGS. 10A to 10D, since predetermined bits of a coupled codeword are used to calculate a shift amount, the calculator 809 receives a coupled codeword output from the shifter 801. After that, the table 807 outputs a base value to the calculator 809 according to the address from the decoder 806. As will be described later, the calculator 809 calculates a pack length using the sum total of the base value and values at predetermined bit positions of a coupled codeword, outputs the calculated pack length to the packer 804, and outputs a shift amount to the shifter 801. Then, the packer 804 generates last single symbol data of coupled symbol data in accordance with the pack length and the initial value of a block input from the input terminal 810, and outputs 16-bit packed pixel data to the output terminal 805. The shifter 801 detects the next coupled codeword according to the shift amount. By repeating the aforementioned operations, the decode operation is attained.

The operations of the decoder 802 and table 803 will be described below with reference to FIGS. 9A and 9B. The codeword numbers and coupled codewords are the same as those in FIGS. 7A and 7B. Differences are that address values of the decoder 802 are added, and each coupled symbol data is extended to the 8th bit. For example, coupled symbol data of the codeword number "0" in FIGS. 7A and 7B is "101". However, in FIGS. 9A and 9B, a decode value "1" of the third symbol as that of the last single symbol is extended to obtain coupled symbol data "101111111". This is for the following reason. That is, since the subsequent packer 804 decides a bit width of coupled symbol data using the pack length indicating the number of decoded pixels, and can decide the value of the coupled symbol data if the start position and value of a decode value of a last single symbol can be detected, the bus width is adjusted to 9 bits of a coupled codeword (each of the codeword numbers "78" to "82") having the farthest start position of the decode value of the last single symbol. With such bit extensions, by assigning the address output from the decoder 802 to data that yield identical coupled symbol data, 85 entries originally required in FIGS. 7A and 7B can be reduced to 21 entries. In this manner, the circuit scales of the decoder 802 and table 803 are reduced.

The operations of the decoder 806 and the tables 807 and 808 will be described below with reference to FIGS. 10A to 10D. A header used to identify a single codeword is the same as that described using FIG. 5.

The decoder 806 decodes a coupled codeword focusing attention on the headers. FIGS. 10A to 10D show a table which is obtained by sorting the decode table in FIGS. 9A and 9B for respective addresses as the outputs from the decoder 806. Also, "shift amount" indicates a shift amount as the output from the table 807, and "base value" indicates an offset value common to each address required to calculate a shift amount. "Number of "1"s" indicates the number of bits "1" other than the headers in each coupled codeword. In FIGS. 10A to 10D, codeword numbers are assigned for the descriptive convenience, but they are different from FIGS. 9A and 9B.

A decode method of an address and shift amount and a calculation method of a pack length will be described below with reference to FIGS. 10A to 10D.

As for codeword numbers "0" to "7", all the headers of single codewords which respectively form coupled codewords are "0". Hence, each of these coupled codewords is decoded as a coupled codeword "0*0*0*" (* is 0 or 1), and the decoder 806 outputs an address "0". At this time, since the code length of each coupled codeword is "6", a shift amount "6" is output to the shifter 801. The pack length is calculated by adding a base "3" and the number of "1"s. That is, in case of the codeword number "0", since the number of "1"s is 0, the pack length is given by 3+0=3. In case of the codeword numbers "1", "2", and "4", since the number of "1"s is 1, the pack length is given by 3+1=4. Also, in case of the codeword numbers "3", "5", and "6", since the number of "1"s is 2, the pack length is given by 3+2=5. In case of the codeword number "7", since th number of "1"s is 3, the pack length is given by 3+3=6. That is, letting code[0:13] (a start bit of coded data is assumed as the 0th bit) be a coupled codeword, the pack length is calculated by a pack length=3+code[1]+code[3]+code[5], and is output to the packer 804.

Likewise, as for codeword numbers "8" to "15", the headers of single codewords which respectively form coupled codewords are the same. Hence, each of these coupled codewords is decoded as a coupled codeword "0*0*0*" (* is 0 or 1), and the decoder 806 outputs an address "1". At this time, since the code length of each coupled codeword is "7", a shift amount "7" is output to the shifter 801. The pack length is calculated by a base "5"+"the number of "1"s", i.e., a pack length=5+code[1]+code[3]+code[6], and is output to the packer 804.

A codeword number "16" corresponds to a case in which the last single codeword of the coupled codeword is an EOB. Hence, this coupled codeword is decoded as a coupled codeword "0*0*110000" (* is 0 or 1), and the decoder 806 outputs an address "2". At this time, since the code length of the coupled codeword is "10", a shift amount "10" is output to the shifter 801. As the pack length, a value "64" indicating bits until the block end (EOB) is output to the packer 804.

As for codeword numbers "17" to "20", the headers of single codewords which respectively form coupled codewords are the same. Hence, each of these coupled codewords is decoded as a coupled codeword "0*0*11######" (* is 0 or 1, ###### is a value ranging from 000100 to 111101 (4 to 61 as decimal numbers), and let n be this value), and the decoder 806 outputs an address "3". At this time, since the code length of each coupled codeword is "12", a shift amount "12" is output to the shifter 801. The pack length is calculated by a base "3"+"the number of "1"s"+n, i.e., a pack length=3+code[1]+code[3]+n, and is output to the packer 804.

As for codeword numbers "21" to "28", the headers of single codewords which respectively form coupled codewords are the same. Hence, each of these coupled codewords is decoded as a coupled codeword "0*10*0*" (* is 0 or 1), and the decoder 806 outputs an address "4". At this time, since the code length of each coupled codeword is "7", a shift amount "7" is output to the shifter 801. Also, the pack length is calculated by a base "5"+"the number of "1"s", i.e., a pack length=5+code[1]+code[4]+code[6], and is output to the packer 804.

As for codeword numbers "29" to "36", the headers of single codewords which respectively form coupled codewords are the same. Hence, each of these coupled codewords is decoded as a coupled codeword "0*10*10*" (* is 0 or 1), and the decoder 806 outputs an address "5". At this time, since the code length of each coupled codeword is "8", a shift amount "8" is output to the shifter 801. Also, the pack length is calculated by a base "7"+"the number of "1"s", i.e., a pack length=7+code[1]+code[4]+code[7], and is output to the packer 804.

A codeword number "37" corresponds to a case in which the last single codeword is an EOB in association with codeword numbers "38" to "41". Hence, this coupled codeword is decoded as a coupled codeword "0*10*110000" (* is 0 or 1), and the decoder 806 outputs an address "6". At this time, since the code length of the coupled codeword is "11", a shift amount "11" is output to the shifter 801. As the pack length, a value "64" indicating bits until the block end (EOB) is output to the packer 804.

As for the codeword numbers "38" to "41", the headers of single codewords which respectively form coupled codewords are the same. Hence, each of these coupled codewords is decoded as a coupled codeword "0*10*11######" (* is 0 or 1, ###### is a value ranging from 000100 to 111011 (4 to 59 as decimal numbers), and let n be this value), and the decoder 806 outputs an address "7". At this time, since the code length of each coupled codeword is "13", a shift amount "13" is output to the shifter 801. The pack length is calculated by a base "5"+"the number of "1"s"+n, i.e., a pack length=5+code[1]+code [4]+n, and is output to the packer 804.

A codeword number "42" corresponds to a case in which the last single codeword is an EOB in association with codeword numbers "43" to "44". Hence, this coupled codeword is decoded as a coupled codeword "0*110000" (* is 0 or 1), and the decoder 806 outputs an address "8". At this time, since the code length of the coupled codeword is "8", a shift amount "8" is output to the shifter 801. As the pack length, a value "64" indicating bits until the block end (EOB) is output to the packer 804.

As for the codeword numbers "43" and "44", the headers of single codewords which respectively form coupled codewords are the same. Hence, each of these coupled codewords is decoded as a coupled codeword "0*11######" (* is 0 or 1, ###### is a value ranging from 000100 to 111110 (4 to 62 as decimal numbers), and let n be this value), and the decoder 806 outputs an address "9". At this time, since the code length of each coupled codeword is "10", a shift amount "10" is output to the shifter 801. The pack length is calculated by a base "2"+"the number of "1"s"+n, i.e., a pack length=2+code[1]+n, and is output to the packer 804.

As for codeword numbers "45" to "52", the headers of single codewords which respectively form coupled codewords are the same. Hence, each of these coupled codewords is decoded as a coupled codeword "10*0*0*" (* is 0 or 1), and the decoder 806 outputs an address "10". At this time, since the code length of each coupled codeword is "7", a shift amount "7" is output to the shifter 801. Also, the pack length is calculated by a base "5"+"the number of "1"s", i.e., a pack length=5+code[2]+code[4]+code[6], and is output to the packer 804.

As for codeword numbers "53" to "60", the headers of single codewords which respectively form coupled codewords are the same. Hence, each of these coupled codewords is decoded as a coupled codeword "10*0*10*" (* is 0 or 1), and the decoder 806 outputs an address "11". At this time, since the code length of each coupled codeword is "8", a shift amount "8" is output to the shifter 801. Also, the pack length is calculated by a base "7"+"the number of "1"s", i.e., a pack length=7+code[2]+code[4]+code[7], and is output to the packer 804.

A codeword number "61" corresponds to a case in which the last single codeword is an EOB in association with codeword numbers "62" to "65". Hence, this coupled codeword is decoded as a coupled codeword "10*0*110000" (* is 0 or 1), and the decoder 806 outputs an address "12". At this time, since the code length of the coupled codeword is "11", a shift amount "11" is output to the shifter 801. As the pack length, a value "64" indicating bits until the block end (EOB) is output to the packer 804.

As for the codeword numbers "62" to "65", the headers of single codewords which respectively form coupled codewords are the same. Hence, each of these coupled codewords is decoded as a coupled codeword "10*0*11######" (* is 0 or 1, ###### is a value ranging from 000100 to 111011 (4 to 59 as decimal numbers), and let n be this value), and the decoder 806 outputs an address "13". At this time, since the code length of each coupled codeword is "13", a shift amount "13" is output to the shifter 801. The pack length is calculated by a base "5"+"the number of "1"s"+n, i.e., a pack length=5+code[2]+code[4]+n, and is output to the packer 804.

As for codeword numbers "66" to "73", the headers of single codewords which respectively form coupled codewords are the same. Hence, each of these coupled codewords is decoded as a coupled codeword "10*10*0*" (* is 0 or 1), and the decoder 806 outputs an address "14". At this time, since the code length of each coupled codeword is "8", a shift amount "8" is output to the shifter 801. Also, the pack length is calculated by a base "7"+"the number of "1"s", i.e., a pack length=7+code[2]+code[5]+code[7], and is output to the packer 804.

As for codeword numbers "74" to "81", the headers of single codewords which respectively form coupled codewords are the same. Hence, each of these coupled codewords is decoded as a coupled codeword "10*10*10*" (* is 0 or 1), and the decoder 806 outputs an address "15". At this time, since the code length of each coupled codeword is "9", a shift amount "9" is output to the shifter 801. Also, the pack length is calculated by a base "9"+"the number of "1"s", i.e., a pack length=9+code[2]+code[5]+code[8], and is output to the packer 804.

A codeword number "82" corresponds to a case in which the last single codeword is an EOB in association with codeword numbers "83" to "86". Hence, this coupled codeword is decoded as a coupled codeword "10*10*110000" (* is 0 or 1), and the decoder 806 outputs an address "16". At this time, since the code length of the coupled codeword is "12", a shift amount "12" is output to the shifter 801. As the pack length, a value "64" indicating bits until the block end (EOB) is output to the packer 804.

As for the codeword numbers "83" to "86", the headers of single codewords which respectively form coupled codewords are the same. Hence, each of these coupled codewords is decoded as a coupled codeword "10*10*11######" (* is 0 or 1, ###### is a value ranging from 000100 to 111001 (4 to 57 as decimal numbers), and let n be this value), and the decoder 806 outputs an address "17". At this time, since the code length of each coupled codeword is "14", a shift amount "14" is output to the shifter 801. The pack length is calculated by a base "7"+"the number of "1"s"+n, i.e., a pack length=7+code[2]+code[5]+n, and is output to the packer 804.

A codeword number "87" corresponds to a case in which the last single codeword is an EOB in association with codeword numbers "88" and "89". Hence, this coupled codeword is decoded as a coupled codeword "10*110000" (* is 0 or 1), and the decoder 806 outputs an address "18". At this time, since the code length of the coupled codeword is "9", a shift amount "9" is output to the shifter 801. As the pack length, a value "64" indicating bits until the block end (EOB) is output to the packer 804.

As for the codeword numbers "88" and "89", the headers of single codewords which respectively form coupled codewords are the same. Hence, each of these coupled codewords is decoded as a coupled codeword "10*11######" (* is 0 or 1, ###### is a value ranging from 000100 to 111100 (4 to 60 as decimal numbers), and let n be this value), and the decoder 806 outputs an address "19". At this time, since the code length of each coupled codeword is "11", a shift amount "11" is output to the shifter 801. The pack length is calculated by a base "4"+"the number of "1"s"+n, i.e., a pack length=4+code[2]+n, and is output to the packer 804.

As for a codeword number "90", a single codeword that forms a coupled codeword is an EOB itself. Hence, this coupled codeword is decoded intact, and the decoder 806 outputs an address "20". At this time, since the code length of the coupled codeword is "6", a shift amount "6" is output to the shifter 801. As the pack length, a value "64" indicating bits until the block end (EOB) is output to the packer 804.

As for a codeword number "91", since a coupled codeword is a single codeword "11****" (**** is a value ranging from 000100 to 111111 (4 to 63 as decimal numbers), and let n be this value) itself, it is decoded intact, and the decoder 806 outputs an address "21". At this time, since the code length of the coupled codeword is "8", a shift amount "8" is output to the shifter 801. The pack length is calculated by a pack length=1+n to have a base "1", and is output to the packer 804.

As described above, in the decoder 806, and the tables 807 and 808, since each coupled codeword is decoded focusing attention on the header configuration, and the pack length is calculated using the number of bits "1" other than the headers in each coupled codeword, 92 entries can be reduced to 22, and the circuit scales of the decoder 806 and the tables 807 and 808 can be reduced.

The operation of the packer 804 will be described below. The packer 804 has a bit width of input coupled symbol data different from that of the packer 304: 5 bits for the packer 304 while 9 bits for the packer 804. Hence, the arithmetic expressions and conditional formulas for equations (3), (12), (13), (15), (35), (36), (37), and (38) are different, as respectively given by:

$$end_n = sdata_{n-1}(8) \tag{3-2}$$

$$\text{When } plen_n \leq 9,\ ext_n = 0 \tag{12-2}$$

$$\text{When } plen_n > 9,\ ext_n = 1 \tag{13-2}$$

$$\text{When } ext_n = 1 \text{ and } ocnt_n \neq 4,\ extptr_n = sum_n - (plen_n - 5) \tag{15-2}$$

$$\text{When } end_{n-1} = 0 \text{ and } ext_{n-1} = 1,\\ buf_n(sptr_{n-1}:eptr_{n-1} - 1) = sdata_{n-1}(0:8) \tag{35-2}$$

$$\text{When } end_{n-1} = 1 \text{ and } ext_{n-1} = 1,\\ buf_n(sptr_{n-1}:eptr_{n-1} - 1) = \text{not}(sdata_{n-1}(0:8)) \tag{36-2}$$

$$\text{When } end_{n-1} = 0 \text{ and } ext_{n-1} = 1,\\ buf_n(extptr_{n-1}:eptr_{n-1}) = sdata_{n-1}(8),\\ sdata_{n-1}(8), \ldots, sdata_{n-1}(8) \tag{37-2}$$

$$\text{When } end_{n-1} = 1 \text{ and } ext_{n-1} = 1,\ buf_n(extptr_{n-1}: eptr_n - 1) = \text{not}(sdata_{n-1}(8), sdata_{n-1}(8), \ldots, sdata_{n-1}(8)) \tag{38-2}$$

Since the operation of the packer 804 is the same as that of the packer 304 shown in FIG. 6 except for these arithmetic expressions and conditional formulas, a description thereof will not be repeated.

As described above, coupled symbol data is stored until the next pixel of the last change point except for decoding of only one symbol, and the packer extends the next pixel value of the last change point by the pack length. In this way, the circuit scales of the decoder and table for coupled symbol data can be reduced by reducing the number of entries of the decode table for coupled symbol data. As for the shift amount and pack length, since a header part of a coupled codeword is decoded, a base value required to calculate the shift amount and pack length is decided, and the pack length is calculated as the sum total of the base value and bits other than the header part. Then, the circuit scales of the decoder and tables for the shift amount and pack length can be reduced by reducing the number of entries of the decode tables for the shift amount and pack length.

In this way, a variable length decoding apparatus which can simultaneously decode coupled symbols with a small circuit scale can be provided.

Third Embodiment

As the variable length coding in the first and second embodiments, runlength coding is executed to have 1 bit/pixel. However, the present invention can also be applied to an arrangement even for multi-valued pixel data (e.g., 8 bits/pixel) in which one block is classified into two representative colors, and an identification signal used to identify to which of two representative colors an input image belongs, and the two representative colors are coded. In this case, the identification signal is runlength-coded, and the two representative colors are set at the head (or the end (immediately after an EOB)) of a block, as shown in FIG. 11. The runlength-coded identification signal is decoded by the method described in the first and second embodiments, thus allowing high-speed processing and a low-cost arrangement.

When one block includes two or more colors, a change point of each color is runlength-coded, and colors for respective change points are coupled to the end (immediately after an EOB of runlength coding) of a block. For example, when block data shown in FIG. 12A is zigzag-scanned in the horizontal direction, as shown in FIG. 12B, three color boundaries (change points) are generated. FIG. 13 shows a packing example of coded codes in FIG. 12B. A runlength up to that boundary is runlength-coded (the number of codewords is four including an EOB), and data for four colors (boundaries+ one color) are packed after these codewords. However, since the number of colors to be packed after the EOB is increased for respective boundaries, (boundaries+1) packs are required irrespective of the number of colors in a block.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-008241 filed Jan. 16, 2009, and No. 2009-008242 filed Jan. 16, 2009 which are hereby incorporated by reference herein in their entirety.

What is claimed is:

1. A decoding apparatus, comprising:
a shifter which detects a start bit of a codeword from coded data;
a memory which stores a first table, a second table and a third table, wherein the first table stores decode values of a plurality of symbol data at one address, the second table stores a shift amount of the shifter, and the third table is used to generate a data length of the decode values of the plurality of symbol data;
a first decoder which is used to generate an address of the first table from the coded data;
a second decoder which is used to generate an address of the second and third tables from the coded data; and
an output unit which is used to couple or separate the decode values of the plurality of symbol data to data for a predetermined fixed number of bits;
wherein the decoding apparatus decodes coded data generated by executing variable length coding to have a pixel block including a plurality of pixels (the number of pixels N) as a unit, and
wherein letting P (bits) be a code size of the pixel block, T (pixels/clock cycle) be a target throughput, x (bits/clock cycle) be a code size to be processed per clock cycle, and y (pixels/clock cycle) be the number of pixels to be processed per clock cycle, at least either of:

$$x \geq (P/N) \times T$$

and $$y \geq T$$

is satisfied.

2. The apparatus according to claim 1, wherein the variable length coding is runlength coding.

3. A method of controlling a decoding apparatus, comprising:
a shift step of detecting a start bit of a codeword from coded data;
a first decode step of generating an address of a first table from the coded data;
a second decode step of generating an address of second and third tables from the coded data; and
an output step of coupling or separating decode values of a plurality of symbol data to data for a predetermined fixed number of bits;
wherein the first table stores the decode values of the plurality of symbol data at one address, the second table stores a shift amount of a shifter, and the third table is used to generate a data length of the decode values of the plurality of symbol data;
wherein the method decodes coded data generated by executing variable length coding to have a pixel block including a plurality of pixels (the number of pixels N) as a unit, and
wherein letting P (bits) be a code size of the pixel block, T (pixels/clock cycle) be a target throughput, x (bits/clock cycle) be a code size to be processed per clock cycle, and y (pixels/clock cycle) be the number of pixels to be processed per clock cycle, at least either of:

$$x \geq (P/N) \times T$$

and $$y \geq T$$

is satisfied.

4. A non-transitory computer-readable storage medium storing a computer program for making a computer function as a decoding apparatus according to claim 1 when the computer loads and executes the computer program.

5. A decoding apparatus for decoding coded data, which is generated by variable length coding, and outputting a plurality of pixel data, the decoding apparatus comprising:
a shifter which detects a start bit of a codeword from coded data;
a memory storing a first table which stores decode values of a plurality of symbol data at one address, a second table which stores a shift amount of the shifter, and a third table which is used to generate a data length of the plurality of symbol data;
a first decoder which is used to generate an address of the first table from the coded data;
a second decoder which is used to generate an address of the second and third tables from the coded data; and
an output unit which is used to couple or separate the decode values of the plurality of symbol data to data for a predetermined fixed number of bits.

6. The apparatus according to claim 5, wherein the variable length coding is runlength coding.

7. The apparatus according to claim 6, wherein the first table stores until a pixel next to a last change point except for decoding of only one symbol.

8. The apparatus according to claim 6, wherein elements of the first table store values under an assumption that a decode value of an immediately preceding pixel is 1 or 0.

9. The apparatus according to claim 8, wherein a decode value based on the first table is output intact when a decode value of an immediately preceding pixel is equal to the assumed value, and a value of the first table is inverted and output when a decode value of an immediately preceding pixel is different from the assumed value.

10. The apparatus according to claim 5, wherein the output unit continuously outputs data of a pixel next to a last change point upon coupling a part exceeding the last change point.

11. The apparatus according to claim 5, wherein the second decoder generates an address from predetermined bits of coded data corresponding to individual symbols.

12. The apparatus according to claim 5, wherein elements of the third table store the shift amount, a base value required to calculate a data length after the symbol data is decoded, and a reference bit position of the detected coded data.

13. The apparatus according to claim 12, wherein the data length of the symbol data is calculated using a sum total of the base value and a value of coded data at the reference bit position.

14. A method of controlling a decoding apparatus for decoding coded data, which is generated by variable length coding, and outputting a plurality of pixel data, wherein the decoding apparatus includes:
- a first table which stores decode values of a plurality of symbol data at one address;
- a second table which stores a shift amount of a shifter; and
- a third table which is used to generate a data length of the plurality of symbol data;

the method comprising:
- a shift step of detecting a start bit of a codeword from coded data;
- a first decode step of generating an address of the first table from the coded data;
- a second decode step of generating an address of the second and third tables from the coded data; and
- an output step of coupling or separating the decode values of the plurality of symbol data to data for a predetermined fixed number of bits.

15. A non-transitory computer-readable storage medium storing a computer program for making a computer execute respective steps of a control method according to claim 14 to function as a decoding apparatus when the computer loads and executes the computer program.

* * * * *